United States Patent
Basho et al.

(10) Patent No.: US 6,921,971 B2
(45) Date of Patent: Jul. 26, 2005

(54) HEAT RELEASING MEMBER, PACKAGE FOR ACCOMMODATING SEMICONDUCTOR ELEMENT AND SEMICONDUCTOR DEVICE

(75) Inventors: Yoshihiro Basho, Kokubu (JP); Ryuji Mori, Kokubu (JP); Masahiko Miyauchi, Kokubu (JP)

(73) Assignee: Kyocera Corporation, Kyoto (JP)

(*) Notice: Subject to any disclaimer, the term of this patent is extended or adjusted under 35 U.S.C. 154(b) by 0 days.

(21) Appl. No.: 10/758,302

(22) Filed: Jan. 15, 2004

(65) Prior Publication Data
US 2005/0035447 A1 Feb. 17, 2005

(30) Foreign Application Priority Data

| Jan. 15, 2003 | (JP) | P2003-007011 |
|---|---|---|
| Jan. 17, 2003 | (JP) | P2003-009843 |
| Jan. 24, 2003 | (JP) | P2003-015996 |
| Jan. 24, 2003 | (JP) | P2003-015997 |
| Jan. 29, 2003 | (JP) | P2003-021122 |
| Jan. 29, 2003 | (JP) | P2003-021123 |
| Feb. 13, 2003 | (JP) | P2003-035703 |
| Mar. 26, 2003 | (JP) | P2003-086191 |
| Mar. 26, 2003 | (JP) | P2003-086195 |

(51) Int. Cl.⁷ .......... H01L 23/10; H01L 23/48
(52) U.S. Cl. .......... 257/706; 257/706; 257/704; 257/675; 257/720; 257/762; 257/796
(58) Field of Search .......... 257/706, 704, 257/675, 720, 762, 796

(56) References Cited

U.S. PATENT DOCUMENTS 5,783,857 A * 7/1998 Ziegner et al. .......... 257/664
6,045,927 A    4/2000 Nakanishi et al.

FOREIGN PATENT DOCUMENTS

| JP | 09-045828 | 2/1997 |
|---|---|---|
| JP | 9-312361 | 12/1997 |

* cited by examiner

*Primary Examiner*—Allan R. Wilson
*Assistant Examiner*—Joseph Nguyen
(74) *Attorney, Agent, or Firm*—Hogan & Hartson LLP

(57) ABSTRACT

A package for accommodating a semiconductor element includes a heat releasing member having a mounting portion for a semiconductor element, a frame having a wiring conductor, and a lid attached so as to cover the mounting portion. In the heat releasing member, a plurality of through-metal members made of a copper are buried in the mounting portion of a substrate made of a matrix of tungsten or molybdenum and copper to another surface. Copper layers are joined at least to upper and lower surfaces of a portion in which the through-metal members are buried, and a cross-section area of each of the through-metal members is gradually increased from the center side of the substrate to a joint portion with the copper layers.

17 Claims, 7 Drawing Sheets

HEAT RELEASING MEMBER, PACKAGE FOR ACCOMMODATING SEMICONDUCTOR ELEMENT AND SEMICONDUCTOR DEVICE

BACKGROUND OF THE INVENTION

1. Field of the Invention

The present invention relates to a package for accommodating a semiconductor element having a heat release structure with good heat releasing properties and a semiconductor device using the same. Furthermore, the present invention relates to a heat releasing member and a package for accommodating a semiconductor element having a heat release structure with good heat releasing properties, and a semiconductor device using the same.

2. Description of the Related Art

Conventionally, a semiconductor-element-accommodating package for accommodating a semiconductor element is generally formed of an insulating frame made of an electric insulating material such as aluminum oxide sintered substances, mullite sintered substances, or glass ceramic sintered substances, a heat releasing member on which a semiconductor element is mounted for satisfactorily releasing heat generated during operation thereof to the air and that is made of an alloy material of copper and tungsten or an alloy material of copper and molybdenum, and a lid. The insulating frame is provided so as to surround a portion on the upper surface of the heat releasing member on which the semiconductor element is mounted, and a plurality of wiring conductors made of tungsten, molybdenum, manganese, copper, silver or the like are attached and extended from the inside to the external surface of a recess formed by the insulating frame and the heat releasing member. Then, the semiconductor element is adhered and fixed onto the portion on the upper surface of the heat releasing member on which the semiconductor element is mounted via an adhesive such as glass, resin, or brazing materials, and each electrode of the semiconductor element is electrically connected to the wiring conductor via a bonding wire. Then, sealing resin such as epoxy resin is injected to the recess formed by the insulating frame and the heat releasing member so as to seal the semiconductor element, and thus a semiconductor device is obtained as a product. This semiconductor device may be mounted on an external heat releasing plate by screwing in order to improve the heat release efficiency.

Such a package for accommodating a semiconductor element provided with a heat releasing member that is made of an alloy material of tungsten and copper or the like has attracted attention as a package for accommodating a semiconductor element on which a high heat generating semiconductor element such as power ICs or high frequency transistors, because the heat conductivity of the heat releasing member is high and the thermal expansion coefficient of the heat releasing member is approximate to the thermal expansion coefficient of silicon or gallium arsenic, which is a constituent material of the semiconductor element, a ceramic material, which is used as a constituent material of the package, or the like.

In recent years, there is a demand for a heat releasing member having a heat conductivity of 300 W/m·K or more, because of a recent increase of the amount of generated heat with increasing integration of power ICs or high frequency transistors. However, the heat conductivity of the heat releasing member made of an alloy material of tungsten and copper or an alloy material of molybdenum and copper as described above is about 200 W/m·K, which is low for this requirement, and thus the heat releasing properties are becoming insufficient.

On the other hand, it has been proposed to use a heat releasing member made of a composite material in which tungsten and copper constitute a matrix. Furthermore, for example, in Japanese Unexamined Patent Publication JP-A 9-312361, it also has been proposed to use a heat conductive substrate made of a composite material in which high heat conductive layers of copper or a copper alloy and low thermal expansion layers made of a Fe—Ni alloy are laminated alternately, and the high heat conductive layers sandwiching the low thermal expansion layer are continuous via a plurality of through-holes formed in the low thermal expansion layer.

However, in a package for accommodating a semiconductor element using the heat release member made of the composite material in which tungsten and copper constitute a matrix, tungsten has a low heat conductivity and a low thermal expansion coefficient, and copper has a high heat conductivity and a high thermal expansion coefficient, so that the heat conductivity and the thermal expansion coefficient of the heat release member can be increased as the content of copper is increased. However, when the content of copper is increased in order to improve the heat conductivity, the difference in the thermal expansion coefficient between the semiconductor element and the heat release member is increased, so that the semiconductor element cannot be joined to the heat releasing member firmly.

When the heat conductive substrate made of a composite material including high heat conductive layers of copper or a copper alloy and low thermal expansion layers made of a Fe—Ni alloy is used, in general, the Fe—Ni alloy has a low heat conductivity (e.g., about 16 W/m·K in the case of a Fe—42Ni alloy), and the heat transfer properties in the thickness direction of the substrate is low.

In addition, in the case of the composite material in which high heat conductive layers of copper or a copper alloy and low thermal expansion layers made of a Fe—Ni alloy are laminated alternately, and the high heat conductive layers sandwiching the low thermal expansion layer are continuous via a plurality of through-holes formed in the low thermal expansion layers materials having different thermal expansion coefficients are disposed in a complex manner, so that the substrate may be bent significantly during heating.

Furthermore, in the package for accommodating a semiconductor element using a heat releasing member made of this composite material, copper expands and is plastically deformed at high temperatures when assembling the package, so that the heat releasing member does not return to the original state and the surface of the heat releasing member becomes rough.

In general, the surface roughness of the heat releasing member should be Ra≦30 µm, where Ra is an arithmetic mean roughness, in order to prevent reduction of the bond strength the heat releasing member and the semiconductor element due to void production in an adhesive when the semiconductor element is adhered and fixed to the heat releasing member via the adhesive such as glass, resin or brazing materials. Therefore, when a heat releasing member made of this composite material is used, the surface is subjected to smoothing by polishing in order to make the surface roughness be Ra≦30 µm, where Ra is the arithmetical mean roughness. However, in the package on which an insulating frame is attached so as to surround the mounting portion for a semiconductor element, the mounting portion cannot be polished.

However, when the surface roughness of the heat releasing member is significantly small, the area in which the heat releasing member and the sealing resin are in contact with each other is decreased, and the anchoring effect of the sealing resin to the heat releasing member is reduced, so that the bond strength between the heat releasing member and the sealing resin is degraded. Thus, peeling may occur at the interface between the heat releasing member and the sealing resin.

Similarly, the sealing resin may cover the entire upper surface of the heat releasing member and the insulating substrate and go up to the side face of the heat releasing member. In this case as well, when the surface roughness on the side face of the heat releasing member is significantly small, the area in which the heat releasing member and the sealing resin are in contact with each other is decreased, and the anchoring effect of the sealing resin to the heat releasing member is reduced, so that the bond strength between the heat releasing member and the sealing resin is degraded. Thus, peeling may occur at the interface between the heat releasing member and the sealing resin.

SUMMARY OF THE INVENTION

An object of the invention is to provide a heat releasing member that can dissipate heat emitted by a semiconductor element to the outside or the air satisfactorily and can adhere the semiconductor element to the heat releasing member firmly by using for a package for accommodating the semiconductor element, and provide a package for accommodating a semiconductor element using the heat releasing member and a semiconductor device using the same.

Another object of the invention is to provide a package for accommodating a semiconductor element that can dissipate heat generated in a semiconductor element satisfactorily to the outside or the air and in which the semiconductor element can be adhered firmly to the heat releasing member and high sealing reliability is provided by the sealing resin, and a semiconductor device using the same.

The invention provides a heat releasing member comprising a frame-like substrate made of a matrix of tungsten or molybdenum and copper, a through-metal member made of copper buried from an upper surface to another surface in a central portion of the frame-like substrate, and copper layers joined onto the one and other surfaces of the substrate and the through-metal member so as to cover the one and other surfaces thereof.

The invention provides a package for accommodating a semiconductor element comprising the heat releasing member being plate-like and having a mounting portion on which a semiconductor element is mounted in a central portion on its upper surface; and a frame attached onto one surface of the heat releasing member so as to surround the mounting portion and having a plurality of wiring conductors extending from a periphery of the mounting portion inside to an outer surface.

In the invention, the through-metal member has an outer circumference larger than that of the semiconductor element by the thickness of the substrate.

In the invention, a size of the one surface of the through-metal member is equal to a size of the semiconductor element, and a size of the other surface thereof is larger than that of the one surface thereof.

In the invention, a cross-section area of the through-metal member is gradually increased from a center side of the substrate to joint portions with the copper layers.

In the invention, an arithmetical mean roughness Ra in a central portion of the one surface of the copper layer on which the semiconductor element is mounted is 0.05 $\mu m \leq Ra \leq 30$ $\mu m$.

According to the invention, the through-metal member made of copper and penetrating from the one surface on the side of the mounting portion for the semiconductor element to the other surface on the back face side is buried in the central portion corresponding to the mounting portion for the semiconductor element in the frame-like substrate constituting the heat releasing member. Therefore, compared with a conventional heat releasing member made only of a matrix of tungsten and copper, a high heat conductive portion made of more copper can be arranged below the mounting portion for the semiconductor element. At this time, the through-metal member has an outer circumference larger than that of the semiconductor element by the thickness of the substrate. Therefore, more heat generated in the semiconductor element can be transmitted in a vertical direction from the mounting portion for the semiconductor element on the one surface to the other surface. In addition, also in the through-metal member, the heat can be spread in the horizontal direction to the outer side from the outer circumference of the semiconductor element by the thickness of the substrate. Consequently, heat generated in the semiconductor element can be dissipated satisfactorily to the air or an external heat releasing plate via this heat releasing member.

Furthermore, the upper and the other surfaces of the through-metal member made of copper and penetrating the substrate from its one surface to its other surface that is buried below the mounting portion for the semiconductor element of the heat releasing member are directly joined to the copper layers joined to the one and other surfaces of the substrate and the through-metal member so as to cover the one and other surfaces thereof. Thus, the copper layers and the through-metal member made of copper make it possible that heat generated in the semiconductor element can be transmitted through the heat releasing member satisfactorily.

Furthermore, the material of the through-metal member has large thermal expansion, but the substrate in a portion other than the through-metal member constituting the heat releasing member is made of a matrix of copper and tungsten or molybdenum having a thermal expansion coefficient equal to that of silicon, gallium arsenic or the like, which is the material of the semiconductor element. Therefore, the thermal expansion of the mounting portion for the semiconductor element is regulated by the thermal expansion of the surrounding frame-like substrate. Thus, although the ratio of copper in the heat releasing member is large, the thermal expansion of the mounting portion for the semiconductor element in the horizontal direction can be suppressed. As a result of those described above, the semiconductor element can be mounted and operated normally and stably for a long time.

According to the invention, the size of the one surface of the through-metal member is equal to the size of the semiconductor element, and the size of the other surface thereof is larger than that of the one surface thereof. Therefore, more heat generated in the semiconductor element can be transmitted in a vertical direction from the mounting portion for the semiconductor element on the one surface to the other surface. In addition, also in the through-metal member, the heat can be spread in the horizontal direction to the outer side from the outer circumference of the semiconductor element by the thickness of the substrate. Consequently, heat generated in the semiconductor element can be dissipated satisfactorily to the air or an external heat releasing plate via this heat releasing member.

According to the invention, since the cross-section area of the through-metal member is gradually increased from the center side of the substrate to a joint portion with the copper layers, the edge portion of the opening of the through-hole in which the through-metal member is buried that is in contact with the copper layers and formed in the plate-like substrate made of a matrix of tungsten or molybdenum and copper forms an obtuse angle. As a result, the contact friction resistance between the end portion of the through-metal member and the opening of the through-hole in the substrate is reduced, so that the through-metal member that has expanded and been plastically deformed can easily return to the original state at the time of cooling from high temperatures in assembling the package for accommodating a semiconductor element. Consequently, the height of projections in the copper layer positioned on the through-metal members that are generated by being pushed up by the through-metal members can be suppressed to, for example, 30 $\mu$m or less. Therefore, there are no voids generated in the adhesive for adhering and fixing the semiconductor element onto the mounting portion of the heat releasing member via the adhesive such as glass, resin or brazing materials. As a result, the semiconductor element can be connected firmly, so that heat generated in the semiconductor element can be transmitted efficiently to the heat releasing member.

According to the invention, since the arithmetical mean roughness Ra in the central portion on the one surface in which the semiconductor element is mounted of the copper layer of the heat releasing member is Ra$\leq$30 $\mu$m, there are no voids generated when adhering and fixing the semiconductor element onto the mounting portion of the heat releasing member via the adhesive such as glass, resin or brazing materials. As a result, the semiconductor element can be connected firmly, so that heat generated in the semiconductor element can be transmitted efficiently to the heat releasing member.

Furthermore, since the arithmetical mean roughness Ra in the central portion on the one surface in which the semiconductor element is mounted of the copper layer of the heat releasing member is 0.05 $\mu$m$\leq$Ra, the area in which the heat releasing member and the sealing resin are in contact with each other can be increased, and the anchoring effect of the sealing resin to the heat releasing member can be increased. Thus, the bond strength between the heat releasing member and the sealing resin can be increased. Consequently, a package for accommodating a semiconductor element having high reliability can be provided.

The invention provides a semiconductor device comprising the package for accommodating a semiconductor element, and a semiconductor element mounted in the mounting portion of the package for accommodating a semiconductor element, wherein an electrode of the semiconductor element is electrically connected to the wiring conductor and a lid is attached onto the one surface of the frame so as to cover the mounting portion.

Furthermore, according to the invention, a semiconductor element is mounted in the mounting portion of the package for accommodating a semiconductor element of the invention having the above-described configuration, an electrode of the semiconductor element is electrically connected to the wiring conductor, and the lid is attached onto the one surface of the frame so as to cover the mounting portion, so that a semiconductor device having the features of the package for accommodating a semiconductor element of the invention as described above in which the semiconductor element is joined to the heat releasing member firmly, and that has very good heat releasing properties and can operate a semiconductor element stably for a long time can be provided.

The invention provides a semiconductor device comprising the package for accommodating a semiconductor element, and a semiconductor element mounted in the mounting portion of the package for accommodating a semiconductor element, wherein an electrode of the semiconductor element is electrically connected to the wiring conductor and a sealing resin is injected into a recess formed by the heat releasing member and the frame to seal the semiconductor element.

Furthermore, according to the invention, the semiconductor device is obtained by mounting a semiconductor element in the mounting portion of the package for accommodating a semiconductor element of the invention having the above-described configuration and electrically connecting en electrode of the semiconductor element to the wiring conductor, and injecting a sealing resin into a recess formed by the heat releasing member and the frame so as to cover the semiconductor element. Therefore, a semiconductor device having the features of the package for accommodating a semiconductor element as described above in which the semiconductor element is joined to the heat releasing member firmly, and that has very good heat releasing properties and can operate a semiconductor element stably for a long time can be provided.

The invention provides a heat releasing member comprising a frame-like substrate made of a matrix of tungsten or molybdenum and copper, a through-metal member made of diamond and a silver-copper alloy copper buried from an upper surface to another surface in a central, portion of the frame-like substrate, and copper layers joined onto the one and other surfaces of the substrate and the through-metal member so as to cover the one and other surfaces thereof.

According to the heat releasing member of the invention, a through-metal member made of diamond and a silver-copper alloy is buried from one surface to another surface in a central portion of a frame-like substrate made of a matrix of tungsten or molybdenum and copper, and copper layers are joined onto the one and other surfaces of the substrate and the through-metal members so as to cover the one and other surfaces thereof. Therefore, compared with a conventional heat releasing member made only of a matrix of tungsten and copper, a high heat conductive portion made of diamond and a silver-copper alloy can be arranged below the semiconductor element, so that more heat generated in the semiconductor element can be transmitted in a direction perpendicular to the mounting plane of the semiconductor element. Consequently., heat generated in the semiconductor element can be dissipated satisfactorily to the air via this heat releasing member.

At this time, the through-metal member has an outer circumference larger than that of the semiconductor element mounted on this heat releasing member by the thickness of the substrate. Therefore, more heat generated in the semiconductor element can be transmitted in a vertical direction from the mounting portion for the semiconductor element on the one surface to the other surface. In addition, also in the through-metal member, the heat can be spread in the horizontal direction to the outer side from the outer circumference of the semiconductor element by the thickness of the substrate. Consequently, the heat generated in the semiconductor element can be dissipated satisfactorily to the air or an external heat releasing plate via this heat releasing member.

Furthermore, the upper and the other surfaces of the through-metal member made of diamond and a silver-copper alloy that penetrates the substrate from its one surface to its other surface and is buried below the central portion of the heat releasing member are directly joined to the copper layers joined to the one and other surfaces of the substrate and the through-metal member so as to cover the one and other surfaces thereof. Thus, the copper layers and the through-metal member made of diamond and a silver-copper alloy make it possible that heat generated in the heat releasing member can be transmitted through the heat releasing member satisfactorily.

Furthermore, the material of the through-metal member has large thermal expansion, but the substrate in a portion other than the through-metal member constituting the heat releasing member is made of a matrix of copper and tungsten or molybdenum having a thermal expansion coefficient equal to that of silicon, gallium arsenic or the like, which is the material of the semiconductor element. Therefore, the thermal expansion of the mounting portion for the semiconductor element is regulated by the thermal expansion of the surrounding frame-like substrate. Thus, although the ratio of copper in the heat releasing member is large, the thermal expansion of the mounting portion for the semiconductor element in the horizontal direction can be suppressed. As a result of those described above, the semiconductor element can be mounted and operated normally and stably for a long time.

The invention provides a package for accommodating a semiconductor element comprising the heat releasing member being plate-like and having a mounting portion on which a semiconductor element is mounted in a central portion on its upper surface, and an frame attached onto one surface of the heat releasing member so as to surround the mounting portion and having a plurality of wiring conductors extending from a periphery of the mounting portion inside to an outer surface.

According to the invention, the package for accommodating a semiconductor element includes the heat releasing member of the invention having the above-described configuration that has a plate-like shape and has a mounting portion on which a semiconductor element is mounted in a central portion on its one surface, and a frame attached onto the one surface of the heat releasing member so as to surround the mounting portion and having a plurality of wiring conductors extending from a periphery of the mounting portion inside to an outer surface. Therefore, a high heat conductive portion made of diamond and a silver-copper alloy can be arranged below the semiconductor element, so that more heat generated in the semiconductor element can be transmitted in a direction perpendicular to the mounting plane of the semiconductor element. Consequently, heat generated in the semiconductor element can be dissipated satisfactorily to the air via this heat releasing member, and the semiconductor element can be mounted and operated normally and stably for a long time.

In the invention, the through-metal member has an outer circumference larger than that of the semiconductor element by the thickness of the substrate.

According to the invention, when the through-metal member has an outer circumference larger than the outer circumference of the semiconductor element by the thickness of the substrate, the heat generated in the semiconductor element is transmitted in a plane direction of the mounting plane as well as in the plane perpendicular to the mounting plane. As a result, the amount of the transmitted heat is increased, so that the heat releasing properties of the heat releasing member are improved. Thus, a semiconductor element can be mounted and operated normally and stably for a long time.

The invention provides a semiconductor device comprising the package for accommodating a semiconductor element, and a semiconductor element mounted in the mounting portion of the package for accommodating a semiconductor element, wherein an electrode of the semiconductor element is electrically connected to the wiring conductor and a lid is attached onto the one surface of the frame so as to cover the mounting portion.

According to the invention, the semiconductor device is obtained by mounting a semiconductor element in the mounting portion of the first package for accommodating a semiconductor element of the invention having the above-described configuration and electrically connecting an electrode of the semiconductor element to the wiring conductor, and attaching the lid onto one surface of the frame so as to cover the mounting portion. Therefore, a semiconductor device having the features of the package for accommodating a semiconductor element of the invention as described above in which the semiconductor element is joined to the heat releasing member firmly, and that has very good heat releasing properties and can operate a semiconductor element stably for a long time can be provided.

The invention provides a semiconductor device comprising the package for accommodating a semiconductor element, and a semiconductor element mounted in the mounting portion of the package for accommodating a semiconductor element, wherein an electrode of the semiconductor element is electrically connected to the wiring conductor and a sealing resin is injected into a recess formed by the heat releasing member and the frame to seal the semiconductor element.

According to the invention, the semiconductor device is obtained by mounting a semiconductor element in the mounting portion of the second package for accommodating a semiconductor element of the invention having the above-described configuration and electrically connecting an electrode of the semiconductor element to the wiring conductor, and injecting the sealing resin into the recess formed by the heat releasing member and the frame so as to cover the mounting portion. Therefore, a semiconductor device having the features of the package for accommodating a semiconductor element of the invention as described above in which the semiconductor element is joined to the heat releasing member firmly, and that has very good heat releasing properties and can operate a semiconductor element stably for a long time can be provided.

The invention provides a package for accommodating a semiconductor element comprising a plate-like heat releasing member having a mounting portion on which a semiconductor element is mounted in a central portion on one surface thereof, a frame attached onto the one surface of the heat releasing member so as to surround the mounting portion and having a plurality of wiring conductors extending from a periphery of the mounting portion inside to an outer surface, and a lid attached onto one surface of the frame so as to cover the mounting portion, wherein in the heat releasing member, a plurality of through-metal members made of a copper are buried from one surface of the mounting portion of a plate-like substrate made of a matrix of tungsten or molybdenum and copper to another surface, copper layers are joined at least to one and other surfaces of a portion in which the through-metal members of the substrate are buried, and a cross-section area of each of the through-metal members is gradually increased from the center side of the substrate to a joint portion with the copper layers.

According to the invention, a plurality of through-metal members made of copper that penetrate the substrate from the one surface to the other surface of the substrate are buried in the mounting portion for the semiconductor element in the substrate of the heat releasing member. Therefore, compared with a heat releasing member made only of a matrix of tungsten and copper, a high heat conductive portion made of more copper can be arranged below the mounting portion for the semiconductor element, and therefore more heat generated in the semiconductor element can be transmitted in a direction perpendicular to the mounting plane of the semiconductor element. Consequently, heat generated in the semiconductor element can be dissipated satisfactorily to the air or an external heat releasing plate via this heat releasing member.

Furthermore, the plurality of through-metal members made of copper and penetrating the substrate from the one surface to the other surface of the substrate that are buried below the mounting portion for the semiconductor element of the heat releasing member are directly joined to the copper layers joined to the one and other surfaces of the substrate. Thus, the copper layers and the through-metal members make it possible that heat generated in the semiconductor element can be transmitted through the heat releasing member satisfactorily. As a result, the heat in the semiconductor element can be dissipated satisfactorily, and the semiconductor element can be operated normally and stably for a long time.

Since the cross-section area of the through-metal members is gradually increased from the center side of the substrate to a joint portion with the copper layers, the edge portions of the openings of the through-holes in which the through-metal members are buried that are in contact with the copper layers and formed in the plate-like substrate made of a matrix of tungsten or molybdenum and copper form an obtuse angle. As a result, the contact friction resistance between the end portions of the through-metal members and the openings of the through holes in the substrate is reduced, so that the through-metal members that have expanded and been plastically deformed can easily return to the original state at the time of cooling from high temperatures in assembling the package for accommodating a semiconductor element. Consequently, the height of projections in the copper layer positioned on the through-metal members that are generated by being pushed up by the through-metal members can be suppressed to, for example, 30 $\mu$m or less. Therefore, there are no voids generated in the adhesive for adhering and fixing the semiconductor element onto the mounting portion of the heat releasing member via the adhesive such as glass, resin or brazing materials. As a result, the semiconductor element can be connected firmly, so that heat generated in the semiconductor element can be transmitted efficiently to the heat releasing member.

The invention provides a semiconductor device comprising the package for accommodating a semiconductor element; and a semiconductor element mounted in the mounting portion of the package for accommodating a semiconductor element, wherein an electrode of the semiconductor element is electrically connected to the wiring conductor and the lid is attached onto the one surface of the frame so as to cover the mounting portion.

According to the invention, a semiconductor element is mounted in the mounting portion of the package for accommodating a semiconductor element of the invention having the above-described configuration, an electrode of the semiconductor element is electrically connected to the wiring conductor, and the lid is attached onto the one surface of the frame so as to cover the mounting portion, so that a semiconductor device having the features of the package for accommodating a semiconductor element of the invention as described above in which the semiconductor element is joined to the heat releasing member firmly, and that has very good heat releasing properties and can operate a semiconductor element stably for a long time can be provided.

The invention provides a package for accommodating a semiconductor element comprising a plate-like heat releasing member having a mounting portion on which a semiconductor element is mounted in a central portion on one surface of the plate-like heat releasing member, a frame attached onto the one surface of the heat releasing member so as to surround the mounting portion, and a terminal attached onto one portion of the frame, wherein after the semiconductor element is mounted, the semiconductor element, the mounting portion, the frame and the terminal are sealed with a sealing resin covering up to the side face of the heat releasing member in such a manner that the end portion on the outer side of the terminal is exposed, and wherein in the heat releasing member, a plurality of through-metal members made of a copper are buried from the one surface of the mounting portion of a plate-like substrate made of a matrix of tungsten or molybdenum and copper to the other surface, copper layers are joined at least to the one surface of a portion of the substrate positioned inside the frame and on the other surface of a portion in which the through-metal members are buried, and an arithmetical mean roughness Ra on the one surface of the portion positioned inside the frame and the side face of the heat releasing member is each 0.05 $\mu$m$\leq$Ra$\leq$30 $\mu$m.

According to the invention, a plurality of through-metal members made of copper that penetrate the substrate from the one surface to the other surface of the substrate are buried in the mounting portion for the semiconductor element in the substrate of the heat releasing member. Therefore, compared with a heat releasing member made only of a matrix of tungsten and copper, a high heat conductive portion made of more copper can be arranged below the mounting portion for the semiconductor element, and therefore more heat generated in the semiconductor element can be transmitted in a direction perpendicular to the mounting plane of the semiconductor element. Consequently, heat generated in the semiconductor element can be dissipated satisfactorily to the air or an external heat releasing plate via this heat releasing member.

Furthermore, the plurality of through-metal members made of copper and penetrating the substrate from the one surface to the other surface of the substrate that are buried below the mounting portion for the semiconductor element of the heat releasing member are directly joined to the copper layers joined to the one and other surfaces of the substrate. Thus, the copper layers and the through-metal members make it possible that heat generated in the semiconductor element can be transmitted through the heat releasing member satisfactorily. As a result, the heat in the semiconductor element can be dissipated satisfactorily, and the semiconductor element can be operated normally and stably for a long time.

Furthermore, since the arithmetical mean roughness Ra on the one surface positioned inside the frame including the mounting portion for the semiconductor element of the copper layer jointed to the one surface of the substrate of the heat releasing member is 0.05 $\mu m \leq Ra \leq 30 \mu m$, there are no voids generated when adhering and fixing the semiconductor element onto the mounting portion of the heat releasing member via the adhesive such as glass, resin or brazing materials. As a result, the semiconductor element can be connected firmly, so that heat generated in the semiconductor element can be transmitted efficiently to the heat releasing member, and the area in which the heat releasing member and the sealing resin are in contact with each other can be obtained sufficiently, and the anchoring effect of the sealing resin to the heat releasing member can be increased. Thus, the bond strength between the heat releasing member and the sealing resin can be increased.

Furthermore, since the arithmetical mean roughness Ra on the side face of the heat releasing member covered with the sealing resin is also 0.05 $\mu m \leq Ra \leq 30 \mu m$, moisture is not adsorbed to the joint interface between the side face of the heat releasing member and the sealing resin. Therefore, there is no possibility of occurrence of peeling between the heat releasing member and the sealing resin due to small vapor expansion during heating when the package for accommodating a semiconductor element is connected to the external wiring substrate via solder, and the area in which the heat releasing member and the sealing resin also are in contact with each other can be sufficiently obtained also at the side face of the heat releasing member. At the same time, the anchoring effect of the sealing resin to the heat releasing member can be increased. Thus, the bond strength between the heat releasing member and the sealing resin can be increased.

As a result of those described above, according to the invention, a package for accommodating a semiconductor element having high reliability can be obtained.

The invention provides a semiconductor device comprising the package for accommodating a semiconductor element, and a semiconductor element mounted on the mounting portion of the package for accommodating a semiconductor element, wherein an electrode of the semiconductor element is electrically connected to the terminal, and the semiconductor element, the mounting portion, the frame and the terminal are sealed with a sealing resin covering up to the side face of the heat releasing member in such a manner that an end portion on the outer side of the terminal is exposed.

According to the invention, a semiconductor element is mounted in the mounting portion of the package for accommodating a semiconductor element of the invention having the above-described configuration, an electrode of the semiconductor element is electrically connected to the wiring conductor, and the lid is attached onto the one surface of the frame so as to cover the mounting portion, so that a semiconductor device having the features of the package for accommodating a semiconductor element of the invention as described above in which the semiconductor element is joined to the heat releasing member firmly, and that has very good heat releasing properties and can operate a semiconductor element stably for a long time can be provided.

According to the invention, it is possible to provide a heat releasing member that can dissipate heat emitted by a semiconductor element to the outside or the air satisfactorily and can adhere the semiconductor element to the heat releasing member firmly by using for a package for accommodating the semiconductor element, and provide a package for accommodating a semiconductor element using the heat releasing member and a semiconductor device using the same.

According to the invention, it is possible to provide a package for accommodating a semiconductor element that can dissipate heat generated in a semiconductor element satisfactorily to the outside or the air and in which the semiconductor element can be adhered firmly to the heat releasing member and high sealing reliability is provided by the sealing resin, and a semiconductor device using the same.

BRIEF DESCRIPTION OF THE DRAWINGS

Other and further objects, features, and advantages of the invention will be more explicit from the following detailed description taken with reference to the drawings wherein.

DETAILED DESCRIPTION

The invention will be described with reference to the accompanying drawings.

Figure 1:
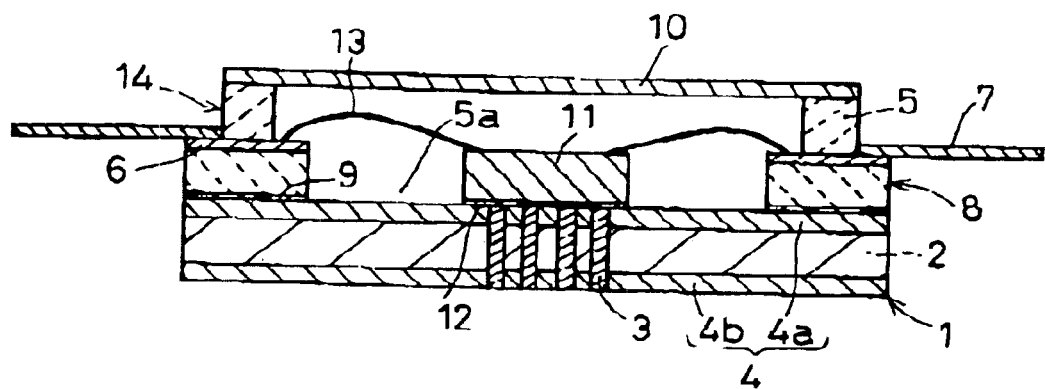
FIG. 1 is a cross-sectional view showing a package for accommodating a semiconductor element and a semiconductor device using the same according to a first embodiment of the invention.

FIG. 1 is a cross-sectional view showing a package for accommodating a semiconductor element and a semiconductor device using the same according to a first embodiment of the invention. Reference numeral 1 denotes a heat releasing member, reference numeral 2 denotes a substrate of the heat releasing member 1, reference numeral 3 denotes a through-metal member, reference numeral 4 (4a, 4b) denotes a copper layer, reference numeral 5 denotes an insulating frame as a frame, reference numeral 6 denotes a wiring conductor, reference numeral 7 denotes a lead terminal, and reference numeral 10 denotes a lid. The heat releasing member 1 and the insulating frame 5 and the lid 10 constitute a semiconductor-element-accommodating package 8 for accommodating a semiconductor element 11. After the semiconductor element 11 is mounted on a mounting portion of the heat releasing member 1, the lid 10 is attached to an upper surface as one surface of the insulating frame 5 in such a manner that the mounting portion is covered, and thus a semiconductor device 14 is formed.

The insulating frame 5 is made of an aluminum oxide sintered substance, a mullite sintered substance, a glass ceramic sintered substance or the like, and is adhered and fixed to the heat releasing member 1 via a brazing material 9. When adhering and fixing with the brazing material 9, in general, a metal layer (not shown) for brazing is formed in a joint portion of the insulating frame 5 and the heat releasing member 1.

The semiconductor element 11 is fixed to the mounting portion, which is a central portion of the upper surface of the heat releasing member 1, via an adhesive 12 such as resin, glass, or brazing materials. When a brazing material is used as the adhesive 12, in general, a metal layer (not shown) for brazing is formed in a joint portion of the heat releasing member 1 with the semiconductor element 11. However, when sufficient brazing can be achieved with the copper layer 4 (4a) jointed to the mounting portion on the upper surface of the heat releasing member 1, a metal layer for brazing is not particularly necessary.

For example, when the insulating frame 5 is made of an aluminum oxide sintered substance, the insulating frame 5 can be produced in the following manner. A suitable organic binder, solvent, plasticizer, dispersant, or the like is added and mixed to a raw material powder such as aluminum oxide, silicon oxide, magnesium oxide, calcium oxide or the like so as to be made into a slurry. This slurry is made into a ceramic green sheet (ceramic crude sheet) by doctor blading or calender rolling. Thereafter, the ceramic green sheet is subjected to stamping as appropriate. A conductive paste obtained by mixing a suitable organic binder or solvent to a metal material powder such as tungsten, molybdenum, manganese, copper, silver, nickel, palladium, or gold is previously applied and printed in a predetermined pattern onto the green sheets by screen printing or the like. Thereafter, a plurality of the green sheets are laminated and fired at a temperature of about 1600° C.

In the insulating frame 5, the wiring conductor 6 extending from the periphery of the mounting portion inside a recess 5a formed by the heat releasing member 1 and the insulating frame 5 to the outer surface of the insulating frame 5 is formed, and each electrode of the semiconductor element 11 is electrically connected to one end inside the recess 5a of the wiring conductor 6 via a bonding wire 13.

The wiring conductor 6 is made of a high melting point metal such as tungsten or molybdenum, and formed by the following manner. A metal paste obtained by adding and mixing a suitable organic binder, solvent or the like to a metal powder such as tungsten or molybdenum is applied and printed in a predetermined pattern onto the ceramic green sheets that become the insulating frame 5 by screen printing or the like. Thus, the wiring conductor 6 is formed from the periphery of the mounting portion inside the recess 5a formed by the heat releasing member 1 and the insulating frame 5 to the outer surface of the insulating frame 5.

Furthermore, when a metal such as nickel or gold having excellent corrosion resistance and excellent bonding properties with respect to the bonding wire 13 is attached onto the exposed surface of the wiring conductor 6 in a thickness of 1 to 20 μm by plating, oxidation corrosion of the wiring conductor 6 can be effectively prevented and the bonding wire 13 can be connected firmly to the wiring conductor 6. Therefore, it is preferable to attach a metal such as nickel or gold having excellent corrosion resistance and excellent bonding properties onto the exposed surface of the wiring conductor 6 in a thickness of 1 to 20 μm.

The heat releasing member 1 has a function of absorbing heat generated with operation of the semiconductor element 11 and dissipating the heat to the air or transferring the heat to an external heat releasing plate. The heat releasing member 1 can be obtained in the following manner, for example. A tungsten powder or a molybdenum powder having an average diameter of 5 to 40 μm is molded by pressure such that a plurality of through-holes are formed in the mounting portion for the semiconductor element 11, and is sintered in an atmosphere with 1300 to 1600° C. to be impregnated with 10 to 50 mass % of copper. Thus, a porous member having the plurality of through-holes formed in the mounting portion for the semiconductor element 11 from the upper surface to a lower surface as another surface is produced beforehand. This porous member is impregnated with copper at about 1200° C. in a hydrogen atmosphere. Thus, the heat releasing member 1 including the plate-like substrate 2 formed of a matrix of tungsten or molybdenum and copper, the plurality of through-metal members 3 made of copper buried in the mounting portion of the substrate 2 from the upper surface to the lower surface, the copper layer 4a joined to the upper surface in a portion positioned inside the insulating frame 5 of the substrate 2, and the copper layer 4b joined to the lower surface in a portion in which the through-metal members 3 of the substrate 2 are buried is formed.

The cross-section area of through-metal member 3 can be gradually increased toward the joint portion with the copper layer 4 (4a, 4b) in a shape of a step or a slope.

The cross-section area of the through-metal member 3 can be increased gradually from the center side of the substrate 2 to the joint portion with the copper layer 4 (4a, 4b) in the following manner. A porous member that becomes the substrate 2 is formed, and a through-hole in which the through-metal member 3 is buried is formed. Thereafter, the edge portion of the opening of this through-hole can be shaped into a predetermined shape with an end mill processing machine or the like. Thus, either shape of a step-like or a slope-like shape can be produced.

A step-like or a slope-like shape can be produced by making a jig pin forming the through-hole in which the through-metal member 3 is buried into a step-like or a slope-like shape toward the opening of the through hole, when forming the porous member that becomes the substrate 2 by molding a tungsten powder or a molybdenum powder by pressure.

When, of the copper layers 4, the copper layer 4a on the upper surface of the substrate 2 that becomes the mounting portion for the semiconductor element 11 has Ra>30 μm on the upper surface thereof, where Ra is the arithmetical mean roughness, voids may be generated in the adhesive 12 when the semiconductor element 11 is adhered and fixed thereto via the adhesive 12 such as glass, resin or brazing materials. The voids generated in the adhesive 12 not only degrade the bond strength between the semiconductor element 11 and the heat releasing member 1, but also inhibit heat transfer between the semiconductor element 11 and the heat releasing member 1 so that the heat dissipation properties of the package 8 for accommodating a semiconductor element and the semiconductor device 14 can be degraded.

The through-metal member 3 is formed such that the cross-section area thereof is increased gradually from the center side of the substrate 2 to the joint portion with the copper layer 4 (4a, 4b). When the cross-section area is uniform like a commonly used through-hole member, the through-metal member expands and pushes up the copper layers on the upper and the lower surface of the substrate at the time of high temperatures when assembling the package for accommodating a semiconductor element. Then, the through-mental member starts to be shrunk when being cooled, but does not completely return to the original state, because copper has been plastically deformed. As a result, the surface roughness of the copper layers is increased. On the other hand, when the through-metal member 3 is formed such that the cross-section area thereof is increased gradually from the center side of the substrate 2 to the joint portion with the copper layer 4 (4a, 4b), the edge portion of the opening of the through-hole in which the through-metal member 3 is buried and that is in contact with the copper layers 4 (4a, 4b) and formed in the plate-like substrate 2 formed of a matrix of tungsten or molybdenum and copper forms an obtuse angle. As a result, the contact friction resistance between the through-metal member 3 and the substrate 2 is reduced, 50 that the through-metal member 3 that has expanded and been plastically deformed at high temperatures in assembling the package 8 for accommodating a semiconductor element can easily return to the original state at the time of cooling. Consequently, it is prevented that the copper layers 4 (4a, 4b) positioned above and below the through-metal member 3 are pushed up and pulled back so that the surface roughness thereof is increased.

When the cross-section area thereof is increased gradually from the center side of the substrate 2 to the joint portion with the copper layer 4 (4a, 4b), it is preferable that the cross-section area of the through-metal member 3 in the joint portion with the copper layers 4 (4a, 4b) is 10% larger than that of the portion positioned in the central portion of the substrate 2. The cross-section area of the through-metal member 3 can be increased up to the middle point between the adjacent through-metal members 3.

On the other hand, it is preferable that the arithmetical mean roughness Ra on the lower surface of the copper layer 4b joined to the lower surface of the substrate 2 on the opposite side to the upper surface on which the semiconductor element 11 is mounted satisfies Ra≦30 μm. In general, the package 8 for accommodating a semiconductor element is connected to a supporting substrate made of a metal substance such as aluminum or copper, or a ceramic substance having a high thermal conductivity by screwing or with melted metal or brazing material such as solder. In this case, when the arithmetical mean roughness Ra on the lower surface of the copper layer 4b of the substrate 2 is Ra>30 μm, it is difficult to adhere sufficiently the package 8 for accommodating a semiconductor element to the supporting substrate, and gaps or voids are generated between the two components. As a result, it is possible that the heat generated in the semiconductor element 11 cannot efficiently be transferred from the package 8 for accommodating a semiconductor element to the supporting substrate. Therefore, it is preferable that the lower surface that is the outer surface at the copper layer 4b on the lower surface is smooth so as to obtain good adhesiveness with the supporting substrate.

It is preferable that the arithmetical mean roughness Ra on the lower surface of the copper layer 4b joined to the lower surface of a portion in which the through-metal member 3 of the substrate 2 is buried on the opposite side to the upper surface on which the semiconductor element 11 is mounted is Ra≦30 μm, and the surface is smooth.

It is preferable that the thickness of the copper layers 4 (4a, 4b) is 800 μm or less, because when the thickness thereof is larger than 800 μm, the stress generated by the difference in the thermal expansion between the substrate 2 and the copper layers 4 (4a, 4b) is increased so that sufficient bond strength cannot be obtained. When the thickness of the copper layers 4 (4a, 4b) is 50 μm or more, heat generated with operation of the semiconductor element 11 is spread sufficiently in the plane direction of the copper layers 4 (4a, 4b), so that the heat releasing properties of the heat releasing member 1 are further improved.

The material of the copper layers 4 (4a, 4b) joined to the upper and the lower surfaces of the substrate 2 of the heat releasing member 1 is not limited to pure copper, but can be various copper alloys including copper as the main component, as long as it has good heat conductivity and provides sufficient bond strength with the substrate 2, which is a matrix of tungsten or molybdenum and copper. This also applies to the through-metal member 3 made of copper.

It is sufficient that the copper layers 4 (4a, 4b) joined to the upper and the lower surfaces of the substrate 2 of the heat releasing member 1 are formed at least, for example, in the mounting portion for the semiconductor element 11 and the joint portion with the external heat releasing plate of the upper and the lower surfaces of a portion in which the plurality of through-metal member 3 are buried, and it is not necessary that the copper layers 4 (4a, 4b) are formed so as to cover the entire surface of the upper and the lower surfaces of the heat releasing member 1 as shown in FIG. 1.

Thus, according to the package 8 for accommodating a semiconductor element described above, the semiconductor element 11 is adhered and fixed onto the mounting portion of the heat releasing member 1 via the adhesive 12 made of glass, resin or brazing materials, and each electrode of the semiconductor element 11 is electrically connected to the predetermined wiring conductor 6 via the bonding wire 13. Thereafter, the lid 10 is attached to the upper surface of the insulating frame 5 so as to cover the mounting portion to seal the semiconductor element 11 in the recess 5a, and thus the semiconductor device 14 can be obtained as a product.

EXAMPLES

Next, samples were produced in the following manner and the package for accommodating a semiconductor element of the invention was evaluated.

First, a releasing member having a size of 34 mm×17.4 mm, and a thickness of 1.9 mm was prepared an the heat releasing member 1 shown in FIG. 1.

The substrate 2 of the heat releasing member 1 is formed of a matrix material of tungsten and copper, and has a thickness of 1.52 mm. The thickness of the copper layers 4 (4a, 4b) of the heat releasing member 1 is each 0.19 mm.

The through-metal members 3 were formed in the substrate 2 with an interval of 1.3 mm. When the size is 0.8 mmϕ in the central portion, those with six kinds of size in the joint portion with the copper layers 4 (4a, 4b) of 0.80 mm, 0.84 mm, 0.88 mm, 1.00 mm, 1.20 mm, and 1.30 mm were prepared. Furthermore, when the size is 1.0 mmϕ in the central portion, those with four kinds of size in the joint portion with the copper layers 4 (4a, 4b) of 1.00 mm, 1.10 mm, 1.20 mm, and 1.30 mm were prepared.

The insulating frame 5 formed of alumina ceramics and the terminal 7 formed of a Fe—Ni—Co alloy were connected to the heat releasing member 1 with a Ag—Cu brazing material, and thus the package 8 for accommodating a semiconductor element was obtained. Thereafter, the height of projection of the copper layers 4 (4a, 4b) that is generated by being pushed up by the through-metal members 3 in the heat releasing member 1 was measured using a measuring device of the surface roughness.

Table 1 shows the test results of the evaluation tests as above.

Table 1 shows the relationship between the cross-section area of the through-metal member 3 (expressed by the diameter (unit: mm) of the through-metal member 3) in the joint portion with the copper layers 4 (4a, 4b) in the package 8 for accommodating a semiconductor element and the higher (unit: μm) of projection generated on the copper layers 4 (4a, 4b) for each case when the diameter of the central portion of the through-metal member 3 is 0.80 mm and 0.10 mm.

TABLE 1

| Diameter of through-metal member (mm) | | Generated projection height (μm) |
|---|---|---|
| Central portion | Joint portion with copper layer | |
| 0.80 | 0.80 | 53 |
| | 0.84 | 36 |
| | 0.88 | 22 |
| | 1.00 | 15 |
| | 1.30 | 7 |
| 0.10 | 0.10 | 56 |
| | 0.11 | 29 |
| | 0.12 | 18 |
| | 0.13 | 11 |

As seen from the results shown in Table 1, there is a distinct relationship between the cross-section area of the through metal member 3 in the joint portion with the copper layers 4 (4a, 4b) and the height of projection generated on the copper layers 4 (4a, 4b).

More specifically, as shown in Table 1, when the cross-section area of the through-metal member 3 in the joint portion with the copper layers 4 (4a, 4b) is the same cross section area in the central portion, the height of projection generated on the copper layers 4 (4a, 4b) is as large as more than 50 μm. Even if the cross section area is larger than that, but when it is lees than 10% larger, the height of projection generated on the copper layers 4 (4a, 4b) is more than 30 μm.

On the other hand, in samples of the package 8 for accommodating a semiconductor element of the invention in which the cross-section area of the through-metal member 3 in the joint portion with the copper layers 4 (4a, 4b) is larger than the cross-section area in the central portion and the cross-section area is gradually increased from the center side of the substrate 2, the height of projection generated on the copper layers 4 (4a, 4b) is not more than 40 μm, and suppressed to about 30 μm or less. In particular, in samples in which the cross-section area of the through-metal member 3 in the joint portion with the copper layers 4 (4a, 4b) is 10% larger than the cross-section area in the central portion, the height of projection generated on the copper layers 4 (4a, 4b) is suppressed to be as small as less than 30 μm, and thus the semiconductor element 11 can be connected onto the copper layer 4 (4a) firmly.

Figure 2:
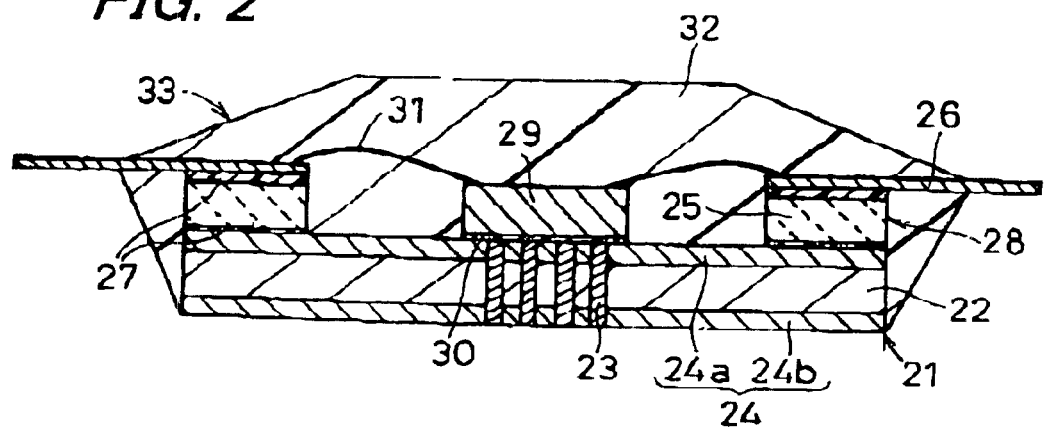
FIG. 2 is a cross-sectional view showing a package for accommodating a semiconductor element and a semiconductor device using the same according to a second embodiment of the invention.

FIG. 2 is a cross-sectional view showing a package for accommodating a semiconductor element and a semiconductor device using the same according to a second embodiment of the invention. Reference numeral 21 denotes a heat releasing member, reference numeral 22 denotes a substrate of the heat releasing member 21, reference numeral 23 denotes a through-metal member, reference numeral 24 (24a, 24b) denotes copper layers, reference numeral 25 denotes an insulating frame as a frame, and reference numeral 26 denotes a terminal. The heat releasing member 21 and the insulating frame 25 and the terminal 26 constitute a semiconductor-element-accommodating package 28 for accommodating a semiconductor element 29. After the semiconductor element 29 is mounted on a mounting portion of the heat releasing member 21, the semiconductor element 29, the mounting portion, the insulating frame 25 and the terminal 26 are sealed with a sealing resin 32 that covers up to the side face of the heat releasing member 1 so that a semiconductor device 33 is formed.

The insulating frame 25 is made of an aluminum oxide sintered substance, a mullite sintered substance, a glass ceramic sintered substance or the like, and is adhered and fixed to the heat releasing member 21 via a brazing material 27. When adhering and fixing with the brazing material 27, in general, a metal layer (not shown) for brazing is formed in a joint portion of the insulating frame 25 and the heat releasing member 21.

The semiconductor element 29 is fixed to the mounting portion, which is a central portion of the upper surface of the heat releasing member 21, via an adhesive 30 such as resin, glass, or brazing materials. When a brazing material is used as the adhesive 30, in general, a metal layer (not shown) for brazing is formed in a joint portion of the heat releasing member 21 with the semiconductor element 29. However, when sufficient brazing can be achieved with the copper layer 24 (24a) jointed to the mounting portion on the upper surface of the heat releasing member 21, a metal layer for brazing it not particularly necessary.

For example, when the insulating frame 25 is made of an aluminum oxide sintered substance, the insulating frame 25 can be produced in the same manner with the insulating frame 5 as mentioned above.

Furthermore, the terminal 26 made of a metal material is connected to the upper portion of the insulating frame 25 via a brazing material 27, and the terminal 26 is electrically connected to each electrode of the semiconductor element 29 via a bonding wire 31.

The terminal 26 is made of a metal material, for example, a Fe—Ni—Co alloy, a Fe—Ni alloy, Cu or the like, and serves to electrically connect the semiconductor element 29 to an external wiring substrate (not shown).

The surface of the terminal 26 is subjected to plating with gold or the like, in order to join it with the insulating frame 25 with brazing material 27 and with bonding wire 31.

In the case where the terminal 26 is plated with gold, it is preferable that the thickness of gold plating is 0.01 µm or more and 5 µm or less in order to obtain stable bonding with the insulating frame 25 and the bonding wire 31.

The heat releasing member 21 has the same function a the heat releasing member 1 mentioned above and can be obtained in the same manner as the heat releasing member 1 mentioned above.

Furthermore, of the copper layers 24, for the copper layer 24a on the mounting portion for the semiconductor element 29 on the upper surface of the substrate 22, the arithmetical mean roughness Ra on the upper surface positioned inside the insulating frame 25 is made to 0.05 µm≦Ra≦30 µm, for example, by polishing.

In the case where the arithmetical mean roughness Ra of the copper layer 24a on the upper surface positioned inside the insulating frame 25 is Ra>30 µm, voids may be generated in an adhesive 10 when the semiconductor element 29 is adhered and fixed via the adhesive 30 such as glass, resin, a brazing material, and the voids generated in the adhesive 30 not only degrade the bond strength between the semiconductor element 29 and the heat releasing member 21, but also inhibit heat transfer between the semiconductor element 29 and the heat releasing member 21 so that the heat dissipation properties of the package 28 for accommodating a semiconductor element and the semiconductor device 33 can be degraded.

However, in the case where the arithmetical mean roughness Ra of the copper layer 24a on the upper surface positioned inside the insulating frame 25 is Ra<0.05 µm, the area in which the copper layer 24a and the sealing resin 32 are in contact with each other is decreased, and the anchoring effect of the sealing resin 32 to the copper layer 24a is produced, so that the bond strength between the copper layer 24a and the sealing resin 32 is degraded. Thus, peeling may occur at the interface between the copper layer 24a and the sealing resin 32.

Thus, it in preferable that the arithmetical mean roughness Ra of the copper layer 24a on the upper surface of a portion positioned inside the insulating frame 25 that becomes the mounting portion in which the semiconductor element 29 is mounted is 0.05 µm≦Ra≦30 µm.

On the other hand, it is preferable that the arithmetical mean roughness Ra on the lower surface of the copper layer 24b joined to the lower surface of the substrate 22 on the opposite side to the upper surface on which the semiconductor element 29 is mounted satisfies Ra≦30 µm. In general, the package 28 for accommodating a semiconductor element is connected to a supporting substrate made of a metal substance such as aluminum or copper, or a ceramic substance having a high thermal conductivity by screwing or with melted metal or brazing material such as solder. In this case, when the arithmetical mean roughness Ra on the lower surface of the copper layer 24b of the substrate 22 is Ra>30 µm, it is difficult to adhere sufficiently the package 28 for accommodating a semiconductor element to the supporting substrate, and gaps or voids are generated between the two components. As a result, it is possible that the heat generated in the semiconductor element 29 cannot efficiently be transferred from the package 28 for accommodating a semiconductor element to the supporting substrate. Therefore, it is preferable that the lower surface that is the outer surface of the copper layer 24b on the lower surface is smooth so as to obtain good adhesiveness with the supporting substrate.

It is preferable that the arithmetical mean roughness Ra on the lower surface of the copper layer 24b joined to the lower surface of a portion in which the through-metal member 23 of the substrate 22 is buried on the opposite side to the upper surface on which the semiconductor element 29 is mounted is Ra≦30 µm, and the surface is smooth.

It is preferable that the thickness of the copper layers 24 (24a, 24b) is 800 µm or less, because when the thickness thereof is larger than 800 µm, the stress generated by the difference in the thermal expansion between the substrate 22 and the copper layers 24 (24a, 24b) is increased so that sufficient bond strength cannot be obtained. When the thickness of the copper layers 24 (24a, 24b) is 50 µm or more, heat generated with operation of the semiconductor element 29 is spread sufficiently in the plane direction of the copper layers 24 (24a, 24b), so that the heat releasing properties of the heat releasing member 21 are further improved.

In the package 28 for accommodating a semiconductor element and the semiconductor device 33 of the invention, the side face of the heat releasing member 21 is covered with the sealing resin 32, so that the side face is, for example, polished so that the arithmetical mean roughness Ra is 0.05 µm≦Ra≦30 µm. The side face of the heat releasing member 21 is constituted by the aide face of the substrate 22 and the side faces of the copper layers 24 (24a, 24b) when the copper layers 24 (24a, 24b) are extended up to the peripheral edge of the substrate 22. When this copper layers 24 (24a, 24b) are not extended up to the peripheral edge of the substrate 22, the side face of the heat releasing member 21 is constituted only by the side face of the substrata 22.

In the case where the arithmetical mean roughness Ra on the side race covered with the scaling resin 32 of the heat releasing member 21 is Ra>30 (µm), moisture tends to be adsorbed onto the interface between the side face of the heat releasing member 21 and the sealing resin 32, the adsorbed moisture causes small vapor expansion during heating when the package 28 for accommodating a semiconductor element is connected to an external wiring substrate via solder. Consequently, peeling may occur at the interface between the side face of the heat releasing member 21 and the sealing resin 32.

Furthermore, in the case where the arithmetical mean roughness Ra in the side face covered with the sealing resin 32 of the heat releasing member 21 is Ra<0.05 µm, the area in which the side face of the heat releasing member 21 and the sealing resin 32 are in contact with each other is decreased, and the anchoring effect of the sealing resin 32 to the side face or the heat releasing member 21 is reduced, so that the bond strength between the side face of the heat releasing member 21 and the sealing resin 32 is degraded. Thus, peeling may occur at the interface between the side face of the heat releasing member 21 and the sealing resin 32.

Thus, it is preferable that the arithmetical mean roughness Ra on the side face covered with the scaling resin 32 of the heat releasing member 21 is 0.05 µm≦Ra≦30 µm.

The material of the copped layers 24 (24a, 24b) joined to the upper and the lower surfaces of the substrate 22 of the heat releasing member 21 is not limited to pure copper, but can be various copper alloys including copper as the main component, as long as it has good heat conductivity and provides sufficient bond strength with the substrate 22, which is a matrix of tungsten or molybdenum and copper. This also applies to the through-metal member 23 made of copper.

For the copper layers 24 (24a, 24b) joined to the upper and the lower surfaces of the substrate 22 of the heat releasing member 21, it is sufficient that of the upper and the lower surfaces of a portion in which a plurality of through-metal members 23 are buried, for the upper surface, the copper layers 24 (24a, 24b) are formed at least in a portion positioned inside the insulating frame 25, and for the lower surface, the copper layers 24 (24a, 24b) are formed so as to cover at least a portion in which the through-metal members 23 are buried. It is not necessary that the copper layers 24 (24a, 24b) are formed so as to cover the entire surface of the upper and the lower surfaces of the substrate 22 of the heat releasing member 21 as shown in FIG. 2.

Thus, according to the package 28 for accommodating a semiconductor element described above, the semiconductor element 29 is adhered and fixed onto the mounting portion of the heat releasing member 21 via the adhesive 30 made of glass, resin or brazing materials, and each electrode of the semiconductor element 29 is electrically connected to the predetermined wiring conductor 26 via the bonding wire 31. Thereafter, as shown in FIG. 2, the semiconductor element 29, the mounting portion, the insulating frame 25 and the terminal 26 are sealed with the sealing resin 32 covering up to the side face of the heat releasing member 21 in such a manner that the outer end portion of the terminal 26 is exposed, and thus the semiconductor device, 33 can be obtained as a product.

EXAMPLES

Next, samples were produced in the following manner and the package for accommodating a semiconductor element of the invention was evaluated.

First, a releasing member having a size of 34 mm×17.4 mm, and a thickness of 1.9 mm was prepared as the heat releasing member 21 shown in FIG. 2.

The substrate 22 of the heat releasing member 21 is formed of a matrix material of tungsten and copper, and has a thickness of 1.52 mm. The thickness of the copper layers 24a and 24b of the heat releasing member 21 is each 0.19 mm.

The side surfaces of the copper layer 24a and the heat releasing member 21 are polished, and eighteen kinds of arithmetical mean roughness Ra from 0.01 μm to 36 μm respectively are prepared.

The insulating frame 25 formed of alumina ceramics and the terminal 26 formed of a Fe—Ni—Co alloy were connected to the heat releasing member 21 with a Ag—Cu brazing material, and thus the package 28 for accommodating a semiconductor element was obtained.

The semiconductor element 29 made of Si (size 5 mm×5 mm, thickness 0.3 mm) was mounted on the upper surface of the copper layer 24a positioned inside the insulating frame 25 of the package 29 for accommodating a semiconductor element with an AuSn brazing material, and then the upper surface and the side face of the package 28 for accommodating a semiconductor element in which the semiconductor element 29 was mounted were sealed with an epoxy-based sealing resin 32, and thus a semiconductor device 33 was obtained.

The semiconductor devise 33 was fed into a temperature cycle test device at −55° C. to 125° C. and taken out aster a predetermined number of test cycles. Then, the interface states of the joint interface portion at the semiconductor element 29 and the copper layer 24 (24a) and the joint interface between the side face portion of the heat releasing member 21 and the sealing resin 32 were observed with an ultrasonic flaw detector and a micro X-ray device to confirm whether or not peeling occurred.

Table 2 shows the test results of the evaluation tests described above.

The number of feeding cycles for the temperature cycle test in the semiconductor device 33 fed to the temperature cycle test, and occurrence of peeking at the interface between the semiconductor element 29 and the copper layers 24 (expressed in "upper portion of copper layer" in Table 2) and the interface between the side face of the heat releasing member 21 and the sealing resin 32 (expressed in "side face" in Table 2) at this time were investigated. Table 2 shows the results for each arithmetical mean roughness (unit: μm) in the upper portion of the copper layer (upper surface of the copper layer 24a) and the side face of the heat releasing member 21, where OK indicates that peeling did not occur, and NG indicates that peeling occurred.

TABLE 2

| Arithmetical mean roughness (μm) | | Number of temperature cycle | | | | |
|---|---|---|---|---|---|---|
| | | 200 | 400 | 600 | 800 | 1000 |
| 0.01 | Upper portion of copper layer | OK | OK | OK | NG | — |
| | Side face | OK | OK | OK | NG | — |
| 0.02 | Upper portion of copper layer | OK | OK | OK | OK | NG |
| | Side face | OK | OK | OK | OK | NG |
| 0.03 | Upper portion of copper layer | OK | OK | OK | OK | NG |
| | Side face | OK | OK | OK | OK | NG |
| 0.05 | Upper portion of copper layer | OK | OK | OK | OK | OK |
| | Side face | OK | OK | OK | OK | OK |
| 0.07 | Upper portion of copper layer | OK | OK | OK | OK | OK |
| | Side face | OK | OK | OK | OK | OK |
| 0.1 | Upper portion of copper layer | OK | OK | OK | OK | OK |
| | Side face | OK | OK | OK | OK | OK |
| 0.3 | Upper portion or copper layer | OK | OK | OK | OK | OK |
| | Side face | OK | OK | OK | OK | OK |
| 0.7 | Upper portion of copper layer | OK | OK | OK | OK | OK |
| | Side face | OK | OK | OK | OK | OK |
| 1.0 | Upper portion of copper layer | OK | OK | OK | OK | OK |
| | Side face | OK | OK | OK | OK | OK |
| 5 | Upper portion of copper layer | OK | OK | OK | OK | OK |
| | Side face | OK | OK | OK | OK | OK |
| 7 | Upper portion of copper layer | OK | OK | OK | OK | OK |
| | Side face | OK | OK | OK | OK | OK |
| 11 | Upper portion of copper layer | OK | OK | OK | OK | OK |
| | Side face | OK | OK | OK | OK | OK |
| 18 | Upper portion of copper layer | OK | OK | OK | OK | OK |
| | Side face | OK | OK | OK | OK | OK |
| 22 | Upper portion of copper layer | OK | OK | OK | OK | OK |
| | Side face | OK | OK | OK | OK | OK |
| 28 | Upper portion of copper layer | OK | OK | OK | OK | OK |
| | Side face | OK | OK | OK | OK | OK |
| 30 | Upper portion of copper layer | OK | OK | OK | OK | OK |
| | Side face | OK | OK | OK | OK | OK |
| 32 | Upper portion of copper layer | OK | OK | OK | OK | NG |
| | Side face | OK | OK | OK | OK | NG |
| 36 | Upper portion of copper layer | OK | OK | OK | NG | — |
| | Side face | OK | OK | OK | NG | — |

As seen from the results shown in Table 2, there is a distinct relationship between the arithmetical mean roughness Ra on the upper surface of the copper layer 24a and the side face of the heat releasing member 21 and occurrence of peeling at the interface between the semiconductor element 29 and the copper layer 4 and the interface between the side face of heat releasing member 21 and the sealing resin 32.

More specifically, as shown in Table 2, in the case where the arithmetical mean roughness Ra on the upper surface of the copper layer 24a and the side face of the heat releasing member 21 is less than 0.05 μm, at a feeding cycle of 1000 or less, peeling occurred at the interface between the semiconductor element 29 and the copper layer 24 and the interface between the side face of heat releasing member 21 and the sealing resin 32, which indicates that the semiconductor device 29 does not have high sealing reliability.

Furthermore, also in the case where arithmetical mean roughness Ra on the upper surface of the copper layer 24a and the side face of the heat releasing member 21 is more than 30 μm, at a feeding cycle of 1000 or less, peeling occurred at the interface between the semiconductor element 29 and the copper layer 24 and the interface between the side face of heat releasing member 21 and the sealing resin 32, which indicates that the semiconductor device does not have high sealing reliability.

On the other hand, in the samples that are package 28 for accommodating a semiconductor element and the semiconductor device 33 of the invention, in which the arithmetical mean roughness Ra on the upper surface of the copper layer 24a and the side face of the heat releasing member 21 is 0.05 μm or more and 30 μm or less, even at a feeding cycle of 1000, peeling did not occur at the interface between the semiconductor element 29 and the copper layer 24 and the interface between the side face of heat releasing member 21 and the sealing resin 32, which indicates that the semiconductor device has high sealing reliability.

Figure 3:
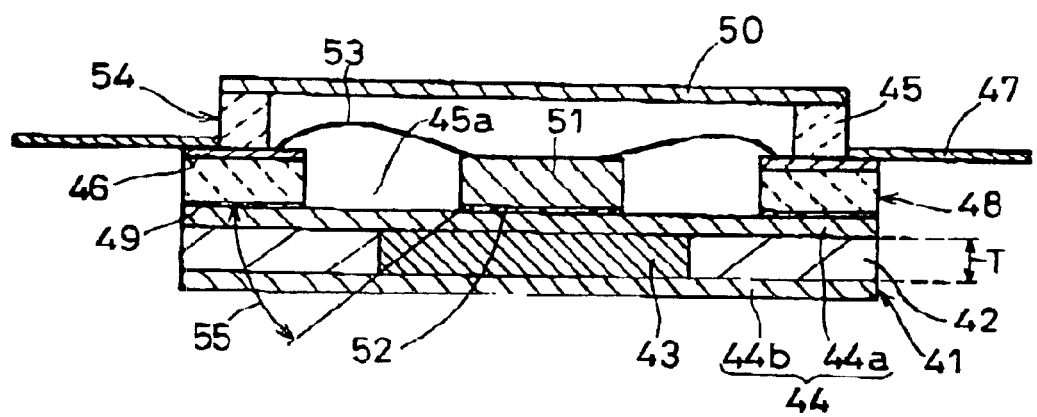
FIG. 3 is a cross-sectional view showing a package for accommodating a semiconductor element and a semiconductor device using the same according to a third embodiment of the invention.

FIG. 3 is a cross-sectional view showing a package for accommodating a semiconductor element and a semiconductor device using the same according to a third embodiment of the invention. Reference numeral 41 denotes a heat releasing member, reference numeral 42 denotes a substrate of the heat releasing member 41, reference numeral 43 denotes a through-metal member, reference numeral 44 (44a, 44b) denotes a copper layer, reference numeral 45 denotes on insulating frame as a frame, reference numeral 46 denotes a wiring conductor, reference numeral 47 denotes a lead terminal, and reference numeral 50 denotes a lid. The heat releasing member 41 and the insulating frame 45 and the lid 50 constitute a semiconductor-element-accommodating package 48 for accommodating a semiconductor element 51. After the semiconductor element 51 is mounted on a mounting portion of the heat releasing member 41, the lid 50 is attached to an upper surface of the insulating frame 45 in such a manner that the mounting portion is covered, and thus a semiconductor device 54 is formed.

The insulating frame 45 is made of an aluminum oxide sintered substance, a mullite sintered substance, a glass ceramic sintered substance or the like, and is adhered and fixed to the heat releasing member 41 via a brazing material 49. When adhering and fixing with the brazing material 49, in general, a metal layer (not shown) for brazing is formed in a joint portion of the insulating frame 45 and the heat releasing member 41.

The semiconductor element 51 is fixed to the mounting portion, which is a central portion of the upper surface of the heat releasing member 41, via an adhesive 52 such as resin, glass, or brazing materials. When a brazing material is used as the adhesive 52, a metal layer (not shown) for brazing is formed in a joint portion of the heat releasing member 41 with the semiconductor element 51. However, when sufficient brazing can be achieved with the copper layer 44 (44a) jointed to the upper surface of the through metal member 43 of the heat releasing member 41, a metal layer for brazing is not particularly necessary.

For example, when the insulating frame 45 is made of an aluminum oxide sintered substance, the insulating frame 45 can be produced in the same manner with the insulating frames 5 and 25 as mentioned above.

In the insulating frame 45, the wiring conductor 46 extending from the periphery of the mounting portion inside a recess 45a formed by the heat releasing member 41 and the insulating frame 45 to the outer surf ace of the insulating frame 45 is formed, and each electrode of the semiconductor element 51 is electrically connected to one and inside the recess 45a of the wiring conductor 46 via a bonding wire 53.

The wiring conductor 46 is made of a high melting point metal such as tungsten or molybdenum, and formed by the following manner. A metal paste obtained by adding and mixing a suitable organic tinder, solvent or the like to a metal powder such as tungsten or molybdenum is applied and printed in a predetermined pattern onto the ceramic green sheets that become the insulating frame 45 by screen printing or the like. Thus, the wiring conductor 46 is formed from the periphery of the mounting portion inside the recess 45a formed by the heat releasing member 41 and the insulating frame 45 to the outer surface of the insulating frame 45.

Furthermore, when a metal such as nickel or gold having excellent corrosion resistance and excellent bonding properties with respect to the bonding wire 53 is attached onto the exposed surface of the wiring conductor 46 in a thickness of 1 to 20 μm by plating, oxidation corrosion or the wiring conductor 46 can be effectively prevented and the bonding wire 53 can be connected firmly to the wiring conductor 46. Therefore, it is preferable to attach a metal such as nickel or gold having excellent corrosion resistance and excellent bonding properties onto the exposed surface of the wiring conductor 46 in a thickness of 1 to 20 μm.

The heat releasing member 41 has a function of absorbing the heat generated with operation of the semiconductor element 51 and dissipating the heat to the air, or transferring the heat to an external heat releasing plate. The heat releasing member 41 can be obtained in the following manner, for example. A tungsten powder or a molybdenum powder having an average particle size of 5 to 40 μm is molded into a frame-like shape by pressure so that, a single through-portion is formed in the mounting portion for the semiconductor element 51, and in sintered in an atmosphere with 1300 to 1600° C. to be impregnated with 10 to 50 mass % of copper. Thus, a porous member having the single through-portion formed in the mounting portion for the semiconductor element 51 from the upper surface to the lower surface is produced beforehand. This porous member is impregnated with copper at about 1200° C. in a hydrogen atmosphere. Thus, the heat releasing member 41 including the frame-like substrate 42 formed of a matrix of tungsten or molybdenum and copper, the single through-metal member 43 made of copper buried in the central portion of the substrate 42 from the upper surface to the lower surface, the copper layer 44a joined so as to cover the upper surface of the substrate 42 and the through-metal member 43, and the copper layer 44b joined to the lower surface at the substrate 42 and the through-metal member 43 is formed.

In the copper layers 44, when the copper layer 44a on the upper surface of the heat releasing member 41 that becomes the mounting portion for the semiconductor element 51 has Ra>30 μm, where Ra is the arithmetical mean roughness on the upper surface thereof, voids may be generated in the adhesive 52 when the semiconductor element 51 is adhered and fixed thereto via the adhesive 52 such as glass, resin or brazing materials. The voids generated in the adhesive 52 not only degrade the bond strength between the semiconductor element 51 and the heat releasing member 41, but also inhibit heat transfer between the semiconductor element 51 and the heat releasing member 41 so that the heat dissipation properties of the package 48 for accommodating a semiconductor element and the semiconductor device 54 can be degraded.

Therefore, it is preferable that the arithmetical mean roughness Ra of the copper layer 44a on the upper surface of the substrate 42 that becomes the mounting portion for the semiconductor element 51 satisfies Ra≦30 μm so that its surface is smooth.

Figure 4:
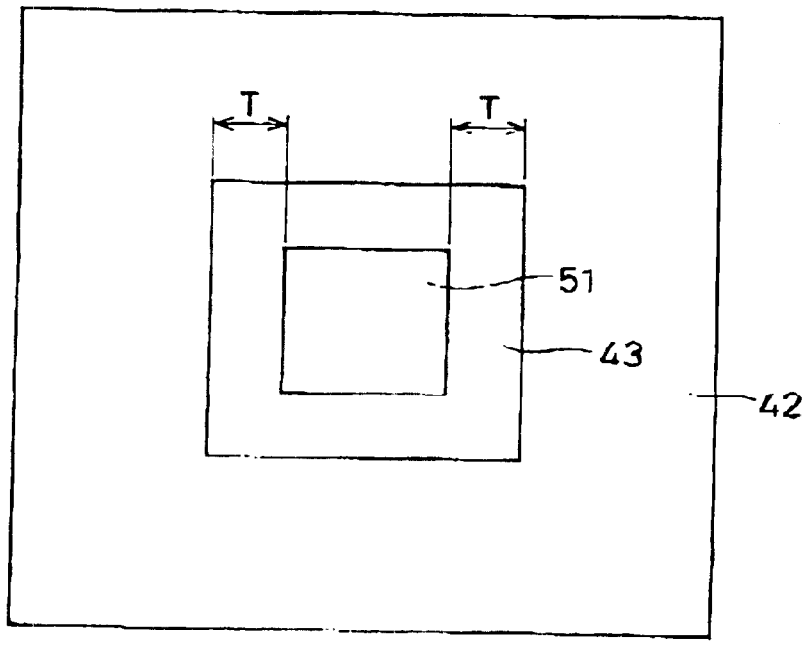
FIG. 4 is a plan view of a substrate when a heat releasing member of the invention is viewed from a side of a mounting portion.

As shown in the plan view of the substrate 42 when the heat releasing member 41 is viewed from the side of the mounting portion in FIG. 4, the through-metal member 43 is formed so as to have an outer circumference that is larger than the outer circumference of the semiconductor element 51 by a thickness T of the substrate 42, that is, an outer circumference that is apart outward from the outer circumference of the semiconductor element 51 by a thickness T of the substrate 42 over the entire outer circumference thereof. In general, in the case of an isotropic material, heat is transmitted equally in the plane direction and the vertical direction, and consequently is transmitted with a spread of about 45 degrees. Therefore, it is preferable that the through-metal member 43 has an outer circumference that is larger than the outer circumference of the semiconductor element 51 by a thickness T of the substrate 42 in order to obtain about 45 degrees as an angle 55 made by the through-metal member 43 and the region of the mounting portion for the semiconductor element 51.

On the other hand, it is preferable that the arithmetical mean roughness Ra on the lower surface of the copper layer 44b joined to the lower surface of the substrate 42 and the through-metal member 43 on the opposite side to the upper surface on which the semiconductor element 51 is mounted satisfies Ra≦30 μm. In general, the package 48 for accommodating a semiconductor element is connected to a supporting substrate made of a metal substance such as aluminum or copper or a ceramic substance having a high thermal conductivity by screwing or with melted metal or brazing material such as solder. In this case, when the arithmetical mean roughness Ra on the lower surface of the copper layer 44b is Ra>30 μm, it is difficult to adhere sufficiently the package 48 for accommodating a semiconductor element to the supporting substrate, and gaps or voids are generated between the two components. As a result, it is possible that the heat generated in the semiconductor element 51 cannot efficiently be transferred from the package 48 for accommodating a semiconductor element to the supporting substrate. Therefore, it is preferable that the lower surface, which in the outer surface of the copper layer 44b on the lower surface, is as smooth so ad to have arithmetical mean roughness Ra≦30 μm to obtain good adhesiveness with the supporting substrate.

It is preferable that the thickness of the copper layers 44 (44a, 44b) is 800 μm or less, because when the thickness thereof is larger than 800 μm, the stress generated by the difference in the thermal expansion between the substrate 42 and the copper layers 44 (44a, 44b) is increased so that sufficient bond strength cannot be obtained. When the thickness of the copper layers 44 (44a, 44b) is 50 μm or more, heat generated with operation of the semiconductor element 51 is spread sufficiently in the plane direction of the copper layers 44 (44a, 44b), so that the heat releasing properties of the heat releasing member 41 are further improved.

The material of the copper layers 44 (44a, 44b) joined to the upper and the lower surfaces of the substrate 42 of the heat releasing member 41 and the through-metal member 43 is not limited to pure copper, but can be various copper alloys including copper as the main component, as long as it has good heat conductivity and provides sufficient bond strength with the substrate 42, which is a matrix of tungsten or molybdenum and copper, and the through-metal member 43 made of copper.

Thus, according to the package 48 for accommodating a semiconductor element described above, the semiconductor element 51 is adhered and fixed onto the mounting portion of the heat releasing member 41 via the adhesive 52 made of glass, resin or brazing materials, and each electrode of the semiconductor element 51 is electrically connected to the predetermined wiring conductor 46 via the bonding wire 53. Thereafter, the lid 50 is attached to the upper surface of the insulating frame 45 so as to cover the mounting portion to seal the semiconductor element 51 in the recess 45a, and thus the semiconductor device 54 can be obtained as a product.

Figure 5:
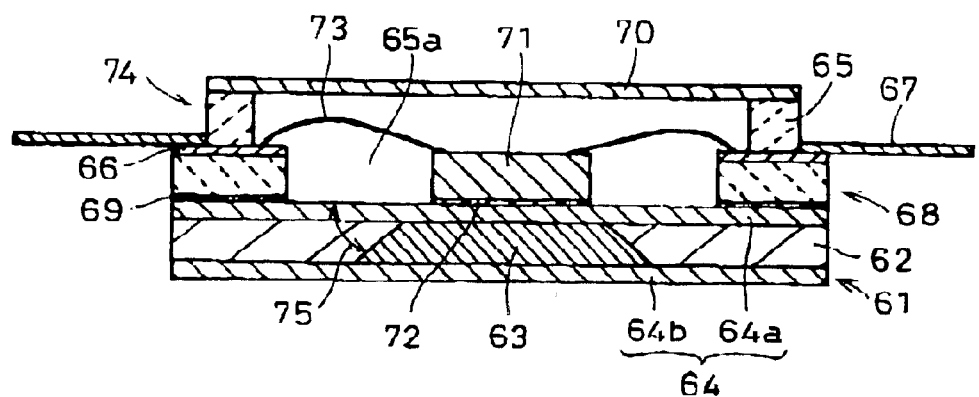
FIG. 5 is a cross-sectional view showing a package for accommodating a semiconductor element and a semiconductor device using the same according to a fourth embodiment of the invention.

FIG. 5 is a cross-sectional view showing a package for accommodating a semiconductor element and a semiconductor device using the same according to a fourth embodiment of the invention. Reference numeral 61 denotes a heat releasing member, reference numeral 62 denotes a substrate of the heat releasing member 61, reference numeral 63 denotes a through-metal member, reference numeral 64 (64a, 64b) denotes a copper layer, reference numeral 65 denotes an insulating frame as a frame, reference numeral 66 denotes a wiring conductor, reference numeral 67 denotes a lead terminal, and reference numeral 70 denotes a lid. The heat releasing member 61 and the insulating frame 65 and the lid 70 constitute a semiconductor-element-accommodating package 68 for accommodating a semiconductor element 71. After the semiconductor element 71 is mounted on a mounting portion of the heat releasing member 61, the lid 70 is attached to the upper surface of the insulating frame 65 in such a manner that the mounting portion is covered, and thus a semiconductor device 74 is formed.

The insulating frame 65, is made of an aluminum oxide sintered substance, a mullite sintered substance, a glass ceramic sintered substance or the like, and is adhered and fixed to the upper surface of heat releasing member 61 surrounding the mounting portion via a brazing material 69. When adhering and fixing with the brazing material 69, in general, a metal layer (not shown) for brazing is formed in a joint portion of the insulating frame 65 and the heat releasing member 61.

The semiconductor element 11 is fixed to the mounting portion, which is a central portion of the upper surface of the heat releasing member 61, via an adhesive 72 such as resin, glass, or brazing materials. When a brazing material is used as the adhesive 72, in general, a metal layer (not shown) for brazing is formed in a joint portion of the heat releasing member 61 with the semiconductor element 71. However, when sufficient brazing can be achieved with the copper layer 64 (64a) jointed to the mounting portion on the upper surface of the heat releasing member 61, a metal layer for brazing is not particularly necessary.

For example, when the insulating frame 65 is made of all aluminum oxide sintered substance, the insulating frame 65 can be produced in the same manner with the insulating frames 5, 25 and 45 as described above.

In the insulating frame 65, the wiring conductor 66 extending from the periphery of the mounting portion inside a recess 65a formed by the heat releasing member 61 and the insulating frame 65 to the outer surface of the insulating frame 65 is formed, and each electrode of the semiconductor element 71 is electrically connected to one end inside the recess 65a of the wiring conductor 66 via a bonding wire 73.

The wiring conductor 66 is made of a high molting point metal such as tungsten or molybdenum, and formed by the following manner. A metal paste obtained by adding and mixing a suitable organic binder, solvent or the like to a metal powder such as tungsten or molybdenum is applied and printed in a predetermined pattern onto the ceramic green sheets that become the insulating frame 65 by screen printing or the like. Thus, the wiring conductor 66 is formed from the periphery of the mounting portion inside the recess 65a formed by the heat releasing member 61 and the insulating frame 65 to the outer surface of the insulating frame 65.

Furthermore, when a metal such as nickel or gold having excellent corrosion resistance and excellent bonding properties with respect to the bonding wire 73 is attached onto the exposed surface of the wiring conductor 66 in a thickness of 1 to 20 μm by plating, oxidation corrosion of the wiring conductor 66 can be effectively prevented and the bonding wire 73 can be connected firmly to the wiring conductor 66. Therefore, it is preferable to attach a metal such as nickel or gold having excellent corrosion resistance and excellent bonding properties onto the exposed surface of the wiring conductor 66 in a thickness of 1 to 20 μm.

The heat releasing member 61 has a function of absorbing the heat generated with operation of the semiconductor element 71 and dissipating the heat to the air, or transferring the heat to an external heat releasing plate. The heat releasing member 61 can be obtained in the following manner, for example. A tungsten powder or a molybdenum powder having an average particle size of 5 to 40 μm is molded into a frame-like shape by pressure so that a single through-portion is formed in the mounting portion for the semiconductor element 71, and is sintered in an atmosphere with 1300 to 1600° C. to be impregnated with 10 to 50 mass % of copper. Thus, a porous member having the single through-portion formed in the mounting portion for the semiconductor element 11 from the upper surface to the lower surface is a produced beforehand. This porous member is impregnated with copper at about 1200° C. in a hydrogen atmosphere. Thus, the heat releasing member 61 including the plate-like substrate 62 formed of a matrix of tungsten or molybdenum and copper, the single through-metal member 63 made of copper buried in the central portion of the substrate 62 from the upper surface to the lower surface, the copper layer 64a joined so as to cover the upper surface of the substrate 62 and the through-metal member 63, and the copper layer 64b joined to the lower surface of the substrate 62 and the through-metal member 63 is formed.

When, of the copper layers 64, the copper layer 64a on the upper surface of the heat releasing member 61 that becomes the mounting portion for the semiconductor element 71 has Ra>30 μm, where Ra is the arithmetical mean roughness on the upper surface thereof, voids may be generated in the adhesive 72 when the semiconductor element 71 is adhered and fixed thereto via the adhesive 72 such as glass, resin or brazing materials. The voids generated in the adhesive 72 not only degrade the bond strength between the semiconductor element 71 and the heat releasing member 61, but also inhibit heat transfer between the semiconductor element 71 and the heat releasing member 61 so that the heat dissipation properties of the package 68 for accommodating a semiconductor element and the semiconductor device 74 can be degraded.

Therefore, it is preferable that the arithmetical mean roughness Ra of the copper layer 64a on the upper surface of the substrate 62 that becomes the mounting portion for the semiconductor element 71 satisfies Ra≦30 μm so that its surface is smooth.

The through-metal member 63 is formed such that the size of its upper surface is equal to the size of the semiconductor element 71 in the mounting portion and its lower surface is larger than the upper surface. In general, in the case of an isotropic material, heat is transmitted equally in the plane direction and the vertical direction, and consequently is transmitted with a spread of about 45 degrees. Therefore, it is preferable that the angle 75 made by the side face of the through-metal member 63 and the region of the mounting portion for the semiconductor element 71 is about 45 degrees, and that the cross-sectional area of the through-metal member 63 is increased from the upper surface to the lower surface with an inclination angle of about 45 degree at its side face in this manner.

On the other hand, it is preferable that the arithmetical mean roughness Ra on the lower surface of the copper layer 64b joined to the lower surface of the substrate 62 and the through-metal member 63 on the opposite side to the upper surface on which the semiconductor element 71 is mounted satisfies Ra≦30 μm. In general, the package 68 for accommodating a semiconductor element is connected to a supporting substrate made of a metal substance such as aluminum or copper or a ceramic substance having a high thermal conductivity by screwing or with melted metal or brazing material such as solder. In this case, when the arithmetical mean roughness Ra on the lower surface of the copper layer 64b is Ra>30 μm, it is difficult to adhere sufficiently the package 60 for accommodating semiconductor element to the supporting substrate, and gaps or voids are generated between the two components. As a result, it is possible that the heat generated in the semiconductor element 71 cannot efficiently be transferred from the package 68 for accommodating a semiconductor element to the supporting substrate. Therefore, it is preferable that the lower surface, which is the outer surface of the copper layer 64b on the lower surface, is au smooth so as to have arithmetical mean roughness Ra≦30 μm to obtain good adhesiveness with the supporting substrate.

It is preferable that the thickness of the copper layers 64 (64a, 64b) is 800 μm or less, because when the thickness thereof is larger than 800 μm, the stress generated by the difference in the thermal expansion between the substrate 62 and the copper layers 64 (64a, 46b) is increased so that sufficient bond strength cannot be obtained. When the thickness of the copper layers 64 (64a, 64b) is 50 μm or more, heat generated with operation of the semiconductor element 71 is spread sufficiently in the plane direction of the copper layers 64 (64a, 64b), so that the heat releasing properties of the heat releasing member 61 are further improved.

The material of the copper layers 64 (64a, 64b) joined to the upper and the lower surfaces of the substrate 62 of the heat releasing member 61 is not limited to pure copper, but can be various copper alloys including copper as the main component, as long as it has good heat conductivity and provides sufficient bond strength with the substrate 62 which is a matrix of tungsten or molybdenum and copper, and the through-metal member 63 made of copper.

Thus, according to the, package 68 for accommodating a semiconductor element described above, the semiconductor element 71 is adhered and fixed onto the mounting portion of the heat releasing member 61 via the adhesive 72 made of glass, resin or brazing materials, and each electrode of the semiconductor element 71 is electrically connected to the predetermined wiring conductor 66 via the bonding wire 73. Thereafter, the lid 70 is attached to the upper surface of the insulating frame 65 so as to cover the mounting portion, to seal the semiconductor element 71 in the recess 65a, and thus the semiconductor device 74 can be obtained as a product.

Figure 6:
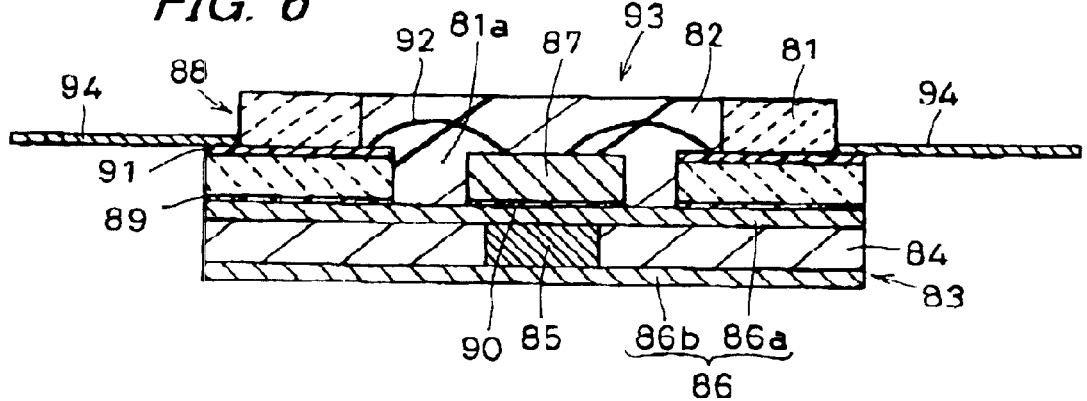
FIG. 6 is a cross-sectional view showing a package for accommodating a semiconductor element and a semiconductor device using the same according to a fifth embodiment of the invention.

FIG. 6 is a cross-sectional view showing a package for accommodating a semiconductor element and a semiconductor device using the same according to a fifth embodiment of the invention. Reference numeral 81 denotes an insulating frame as a frame, reference numeral 82 denotes a sealing resin, and reference numeral 83 denotes a heat releasing member. The insulating frame 81, the sealing resin 82, and the heat releasing member 83 constitute a semiconductor-element-accommodating package 88 for accommodating a semiconductor element 87 of the invention. After the semiconductor element 87 is mounted on a mounting portion of the heat releasing member 83, the sealing resin 82 such as epoxy is injected to a recess formed by the insulating frame 81 and the heat releasing member 83 to seal the semiconductor element 87. Thus, a semiconductor device 93 of the invention is formed.

The insulating frame 81 is made of an aluminum oxide sintered substance, a mullite sintered substance, a glass ceramic sintered substance or the like, and is adhered, fixed and attached to the heat releasing member 83 via a brazing material 89. When adhering and fixing with the brazing material 89, in general, a metal layer (not shown) for brazing is formed in a joint portion of the insulating frame 81 and the heat releasing member 83.

The semiconductor element 87 is fixed to the mounting portion, which is a central portion of the upper surface of the heat releasing member 83, via an adhesive 90 such as resin, glass, or brazing materials. When a brazing material is used as the adhesive 90, in general, a metal layer (not shown) for brazing is formed in a joint portion of the heat releasing member 83 with the semiconductor element 87. However, when sufficient brazing can be achieved with the copper layer 86 (86*a*) jointed to the mounting portion on the upper surface of the heat releasing member 83, a metal layer for brazing is not particularly necessary.

For example, when the insulating frame 81 is made of an aluminum oxide sintered substance, the insulating frame 65 can be produced in the same manner with the insulating frames 5, 25, 45 and 65 as described above.

In the insulating frame 81, the wiring conductor 91 extending from a recess 81*a* formed by the insulating frame 81 and the heat releasing member 83 to the outer surface of the insulating frame 81 is formed, and each electrode of the semiconductor element 87 is electrically connected to one end of the wiring conductor 91 via a bonding wire 92.

The wiring conductor 91 is made of a high melting point metal such as tungsten or molybdenum, and formed by the following manner. A metal paste obtained by adding and mixing a suitable organic binder, solvent or the like to a metal powder such as tungsten or molybdenum is applied and printed in a predetermined pattern onto the ceramic green sheets that become the insulating frame 81 by screen printing or the like. Thus, the wiring conductor 91 is formed from the recess 81 formed by the insulating frame 81 and the heat releasing member 83 to the outer surface of the insulating frame 81.

Furthermore, when a metal such as nickel or gold having excellent corrosion resistance and excellent bonding properties with respect to the bonding wire 92 is attached onto the exposed surface of the wiring conductor 91 in a thickness of 1 to 20 μm by plating, oxidation corrosion of the wiring conductor 91 can be effectively prevented and the bonding wire 92 can be connected firmly to the wiring conductor 91. Therefore, it is preferable to attach a metal such as nickel or gold having excellent corrosion resistance and excellent bonding properties onto the exposed surface of the wiring conductor 91 in a thickness of 1 to 20 μm.

The heat releasing member 83 has a function of absorbing the boat generated with operation of the semiconductor element 87 and dissipating the heat to the air. The heat releasing member 83, can be obtained in the following manner, for example. A tungsten powder or a molybdenum powder having an average particle size of 5 to 40 μm is molded into a frame-like shape by pressure so that a through-portion in which a through-metal member 85 is buried is formed in the mounting portion for the semiconductor element 87, and is sintered in an atmosphere with 1300 to 1600° C. to be impregnated with 10 to 50 mass % of copper. Thus, a porous member having the through-portion formed in the mounting portion for the semiconductor element 67 from the upper surface to the lower surface is produced beforehand. This porous member is impregnated with copper at about 1200° C. in a hydrogen atmosphere. Thus, the substrate 84 formed of a matrix of tungsten or molybdenum and copper is formed. Then, the through-metal member 85 is buried in the substrate 84, and the copper layers 86 (86*a*, 86*b*) are joined to the upper and the lower surfaces thereof, so that the heat releasing member 83 in the package 88 for accommodating a semiconductor element of the invention is formed.

In the copper layer 86 (86*a*), the central portion on the upper surface on which the semiconductor element 87 is mounted is, for example, polished so that the arithmetical mean roughness Ra is 0.05 μm≦Ra≦30 μm.

When the arithmetical mean roughness Ra in the central portion on the upper surface on which the semiconductor element 87 is mounted of the copper layer 86*a* is Ra>30 μm, voids may be generated in the adhesive 90 when the semiconductor element 87 is adhered and fixed thereto via the adhesive 90 such as glass, resin or brazing materials. The voids generated in the adhesive 90 not only degrade the bond strength between the semiconductor element 87 and the heat releasing member 83, but also inhibit heat transfer between the semiconductor element 87 and the heat releasing member 83 so that the heat dissipation properties of the package 88 for accommodating a semiconductor element can be degraded.

In the case where the arithmetical mean roughness Ra in the central portion on the upper surface on which the semiconductor element 87 is mounted of the copper layer 86*a* is Ra<0.05 μm, the area in which the copper layer 86*a* and the sealing resin 82 are in contact with each other is decreased, and the anchoring effect of the sealing resin 82 to the copper layer 86*a* is reduced, so that the bond strength between the copper layer 6*a* and the sealing resin 82 is degraded. Thus, peeling may occur at the interface between the copper layer 86*a* and the sealing resin 82.

Thus, it is preferable that the arithmetical mean roughness Ra of the copper layer 86*a* in the central portion on the upper surface the mounting portion in which the semiconductor element 87 is mounted is 0.05 μm≦Ra≦30 μm.

On the other hand, it is preferable that the arithmetical mean roughness Ra on the lower surface of the copper layer 86*b* on the opposite side to the upper surface on which the semiconductor element 87 is mounted satisfies Ra≦30 m. In general, the package 88 for accommodating a semiconductor element is connected to a supporting substrate made of a metal substance such as aluminum or copper, or a ceramic substance having a high thermal conductivity by screwing or with melted metal or brazing material such as solder. In this case, when the arithmetical mean roughness Ra on the lower surface of the copper layer 86*b* is Ra>30 μm, it is difficult to adhere sufficiently the package 88 for accommodating a semiconductor element to the supporting substrate, and gaps or voids are generated between the two components. As a result, it is possible that the heat generated in the semiconductor element 87 cannot efficiently be transferred from the package 88 for accommodating a semiconductor element to the supporting substrate. Therefore, it is preferable that the surface of the copper layer 86b on the lower surface is smooth so as to obtain good adhesiveness with the supporting substrate.

It is preferable that the arithmetical mean roughness Ra on the lower surface of the copper layer 86b on the opposite side to the upper surface on which the semiconductor element 87 is mounted is Ra≦30 μm, and the surface is smooth.

It is preferable that the thickness of the copper layers 86 (86a, 86b) is 800 μm or less, because when the thickness thereof is larger than 800 μm, the stress generated by the difference in the thermal expansion between the substrate 84 made of matrix and the copper layers 86 (86a, 86b) is increased so that sufficient bond strength cannot be obtained. When the thickness of the copper layers 86a is 50 μm or more, heat generated with operation of the semiconductor element 87 is spread sufficiently in the plane direction of the copper layers 86a, so that the heat releasing properties of the heat releasing member 83 are further improved.

The material of the copper layers 86 (86a, 86b) joined to the upper and the lower surfaces of the heat releasing member 83 is not limited to pure copper, but can be various copper alloys including copper as the main component, as long as it has good heat conductivity and provides sufficient bond strength with the substrate 84, which is a matrix of tungsten or molybdenum and copper. This also applies to the through-metal member 85 made of copper.

It is sufficient that the copper layers 86 (86a, 86b) joined to the upper and the lower surfaces of the heat releasing member 83 are formed at least, for example, in the mounting portion for the semiconductor element 87 and the joint portion with the external heat releasing plate of the upper and the lower surfaces of a portion in which the plurality of through-metal member 85 are buried, and it is not necessary that the copper layers 86 (86a, 86b) cover the entire surface of the upper and the lower surfaces of the heat releasing member 83.

Thus, according to the package 88 for accommodating a semiconductor element of the invention as described above, the semiconductor element 87 is adhered and fixed onto the mounting portion of the heat releasing member 83 via the adhesive 90 made of glass, resin or brazing materials, and each electrode of the semiconductor element 87 is electrically connected to the predetermined wiring conductor 91 via the bonding wire 92, and is electrically connected to the external lead terminal 94 attached to the wiring conductor 91 for interconnection, if necessary. Thereafter, the sealing resin 82 is injected to the recess 81a formed by the heat releasing member 83 and the insulating frame 81 so as to seal the semiconductor element 87, and the semiconductor element 87 is accommodated in the recess 81a. Thus, the semiconductor device can be obtained as a product.

EXAMPLES

Next, samples were produced in the following manner and the package for accommodating a semiconductor element and a semiconductor device of the invention was evaluated.

First, a releasing member having a size of 34 mm×17.4 mm, and a thickness of 1.9 mm was prepared as the heat releasing member 83 shown in FIG. 6.

The substrate 82 of the heat releasing member 83 is formed of a matrix material of tungsten and copper, and has a thickness of 1.52 mm. The thickness of the copper layers 86 (86a, 86b) of the heat releasing member 83 is each 0.19 mm.

The side surfaces of the copper layer 86a on the mounting portion side and the heat releasing member 83 are polished, and eighteen kinds of arithmetical mean roughness Ra from 0.01 μm to 36 μm respectively are prepared.

The insulating frame 81 formed of alumina ceramics was connected to the heat releasing member 83 with a Ag—Cu brazing material, and thus the package 88 for accommodating a semiconductor element was obtained.

The semiconductor element 87 made of Si (size 5 mm×5 mm, thickness 0.3 mm) was mounted on the upper surface of the copper layer 86a positioned inside the insulating frame 81 of the package 88 for accommodating a semiconductor element with an AuSn brazing material, and then the upper surface of the package 88 for accommodating a semiconductor element in which the semiconductor element 87 was mounted were sealed with an epoxy-based sealing resin 82, and thus a semiconductor device 93 was obtained.

The semiconductor device 93 was fed into a temperature cycle test device at −55° C. to 125° C. and taken out after a predetermined number of test cycles. Then, the interface state of the joint interface portion of the semiconductor element 87 and the copper layer 86a was observed with an ultrasonic flaw detector and a micro X-ray device to confirm whether or not peeling occurred.

Table 3 shows the test results of the evaluation tests described above.

The number of feeding cycles for the temperature cycle test in the semiconductor device 93 fed to the temperature cycle test, and occurrence of peeking at the interface between the semiconductor element 87 and the copper layers 86a (expressed in "upper portion of copper layer" in Table 3) at this time was investigated. Table 3 shows the results for each arithmetical mean roughness (unit: μm) in the upper portion of the copper layer (upper surface of the copper layer 86a) where OK indicates that peeling did not occur, and NG indicates that peeling occurred.

TABLE 3

| Arithmetical mean roughness (μm) | | Number of temperature cycle | | | | |
|---|---|---|---|---|---|---|
| | | 200 | 400 | 600 | 800 | 1000 |
| 0.01 | Upper portion of copper layer | OK | OK | OK | NG | — |
| 0.02 | Upper portion of copper layer | OK | OK | OK | OK | NG |
| 0.03 | Upper portion of copper layer | OK | OK | OK | OK | NG |
| 0.05 | Upper portion of copper layer | OK | OK | OK | OK | OK |
| 0.07 | Upper portion of copper layer | OK | OK | OK | OK | OK |
| 0.1 | Upper portion of copper layer | OK | OK | OK | OK | OK |
| 0.3 | Upper portion of copper layer | OK | OK | OK | OK | OK |
| 0.7 | Upper portion of copper layer | OK | OK | OK | OK | OK |
| 1.0 | Upper portion of copper layer | OK | OK | OK | OK | OK |
| 5 | Upper portion of copper layer | OK | OK | OK | OK | OK |
| 7 | Upper portion of copper layer | OK | OK | OK | OK | OK |
| 11 | Upper portion of copper layer | OK | OK | OK | OK | OK |
| 18 | Upper portion of copper layer | OK | OK | OK | OK | OK |
| 22 | Upper portion of copper layer | OK | OK | OK | OK | OK |
| 28 | Upper portion of copper layer | OK | OK | OK | OK | OK |
| 30 | Upper portion of copper layer | OK | OK | OK | OK | OK |
| 32 | Upper portion of copper layer | OK | OK | OK | OK | NG |
| 36 | Upper portion of copper layer | OK | OK | OK | NG | — |

As seen from the results shown in Table 3, there is a distinct relationship between the arithmetical mean roughness Ra on the upper surface of the copper layer 86a and occurrence of peeling at the interface between the semiconductor element 87 and the copper layer 86a and the interface between the semiconductor element 87 and the sealing resin 12.

More specifically, as shown in Table 3, in the case where the arithmetical mean roughness Ra on the upper surface or the copper layer 86a is less than 0.05 μm, at a feeding cycle of 1000 or less, peeling occurred at the interface between the semiconductor element 87 and the copper layer 86a and the interface with the sealing resin 82, which indicates that the semiconductor device 93 does not have high scaling reliability.

Furthermore, also in the case where the arithmetical mean roughness Ra on the upper surface of the copper layer 86a is more than 30 μm, at a feeding cycle of 1000 or less, pooling occurred at the interface between the semiconductor element 87 and the copper layer 86a, which indicates that the semiconductor device does not have high scaling reliability.

On the other hand, in the samples that are package 88 for accommodating a semiconductor element and the semiconductor device 93 of the invention, in which the arithmetical mean roughness Ra on the upper surface of the copper layer 86a is 0.05 μm or more and 30 μm or less, even at a feeding cycle of 1000, peeling did not occur at the interface between the semiconductor element 87 and the copper layer 86a, which indicates that the semiconductor device has high sealing reliability.

Figure 7:
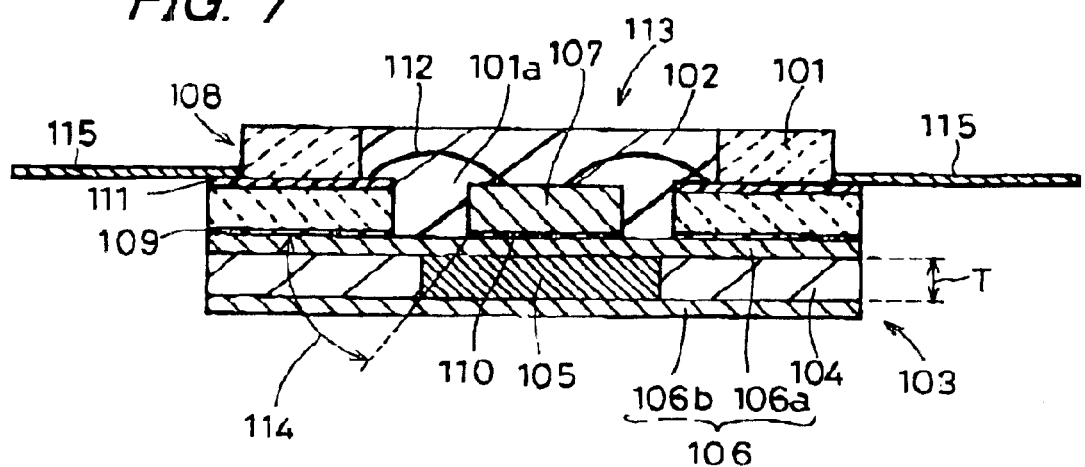
FIG. 7 is a cross-sectional view showing a package for accommodating a semiconductor element and a semiconductor device using the same according to a sixth embodiment of the invention.

FIG. 7 is a cross-sectional view showing a package for accommodating a semiconductor element and a semiconductor device using the same according to a sixth embodiment of the invention. Reference numeral 101 denotes an insulating frame as a frame, reference numeral 102 denotes a sealing resin, and reference numeral 103 denotes a heat releasing member. The insulating frame 101, the sealing resin 102, and the heat releasing member 103 constitute a semiconductor-element-accommodating package 108 for accommodating a semiconductor element 107 of the invention. After the semiconductor element 107 is mounted on a mounting portion of the heat releasing member 103, the sealing resin 102 such as epoxy is injected to a recess formed by the insulating frame 101 and the heat releasing member 103 to seal the semiconductor element 107, and thus a semiconductor device 113 of the invention is formed.

The insulating frame 101 is made of an aluminium oxide sintered substance, a mullite sintered substance, a glass ceramic sintered substance or the like, and is adhered and fixed to the heat releasing member 103 via a brazing material 109. When adhering and fixing with the brazing material 109, in general, a metal layer (not shown) for brazing is formed in a joint portion of the insulating frame 101 and the heat releasing member 103.

The semiconductor element 107 is fixed to the mounting portion, which is a central portion of the upper surface of the heat releasing member 103, via an adhesive 110 such as resin, glass, or brazing materials. When a brazing material is used as the adhesive 110, in general, a metal layer (not shown) for brazing is formed in a joint portion of the heat releasing member 103 with the semiconductor element 107. However, when sufficient brazing can be achieved with the copper layer 106 (106a) jointed to the mounting portion on the upper surface of the heat releasing member 103, a metal layer for brazing is not particularly necessary.

For example, when the insulating frame 101 is made of an aluminum oxide sintered substance, the insulating frame 101 can be produced in the same manner with the insulating frames 5, 25, 45, 65 and 81 as described above.

In the insulating frame 101, the wiring conductor 111 extending from a recess 101a formed by the insulating frame 101 and the heat releasing member 103 to the outer surface of the insulating frame 101 is formed, and each electrode of the semiconductor element 1107 is electrically connected to one end of the wiring conductor 111 via a bonding wire 112.

The wiring conductor 111 is made of a high melting point metal such as tungsten or molybdenum, and formed by the following manner. A metal paste obtained by adding and mixing a suitable organic binder, solvent or the like to a metal powder such as tungsten or molybdenum is applied and printed in a predetermined pattern onto the ceramic green sheets that become the insulating frame 101 by screen printing or the like. Thus, the wiring conductor 111 is formed from the recess 101a formed by the insulating frame 101 and the heat releasing member 103 to the outer surface of the insulating frame 101.

Furthermore, when a metal such as nickel or gold having excellent corrosion resistance and excellent bonding properties with respect to the bonding wire 112 is attached onto the exposed surface of the wiring conductor 111 in a thickness of 1 to 20 μm by plating, oxidation corrosion of the wiring conductor 111 can be effectively prevented and the bonding wire 112 can be connected firmly to the wiring conductor 111. Therefore, it is preferable to attach a metal such as nickel or gold having excellent corrosion resistance and excellent bonding properties onto the exposed surface of the wiring conductor 111 in a thickness of 1 to 20 μm.

The heat releasing member 103 has a function of absorbing the heat generated with operation of the semiconductor element 107 and dissipating the heat to the air. The heat releasing member 103 can be obtained in the following manner, for example. A tungsten powder or a molybdenum powder having an average particle size of 5 to 40 μm is molded into a frame like shape by pressure so that a through-portion in which a through-metal member 105 is buried is formed in the mounting portion for the semiconductor element 107, and is sintered in an atmosphere with 1300 to 1600° C. to be impregnated with 10 to 50 mass % of copper. Thus, a porous member having the through-portion formed in the mounting portion for the semiconductor element 107 from the upper surface to the lower surface is produced beforehand. This porous member is impregnated with copper at about 1200° C. in a hydrogen atmosphere. Thus, the substrate 104 formed or a matrix of tungsten or molybdenum and copper is formed. Then, the through-metal member 105 is buried in the substrate 104, and the copper layers 106 (106a, 106b) are joined to the upper and the lower surfaces thereof, so that the heat releasing member 103 in the package 108 for accommodating a semiconductor element of the invention is formed.

In the copper layer 106 (106a), the central portion on the upper surface on which the semiconductor element 107 is mounted is, for example, polished so that the arithmetical mean roughness Ra is 0.05 μm≦Ra≦30 μm.

When, of the copper layers 106a, the copper layer 106a in the central portion or the upper surface that becomes the mounting portion for the semiconductor element 107 has the arithmetical mean roughness Ra>30 μm, voids may be generated in the adhesive 110 when the semiconductor element 107 is adhered and fixed thereto via the adhesive 110 such as glass, resin or brazing materials. The voids generated in the adhesive 110 not only degrade the bond strength between the semiconductor element 107 and the heat releasing member 103, but also inhibit heat transfer between the semiconductor element 107 and the heat releasing member 103 so that the heat dissipation properties of the package 108 for accommodating a semiconductor element can be degraded.

In the case where the arithmetical mean roughness Ra in the central portion on the upper surface on which the semiconductor element 107 is mounted of the copper layer 106a is Ra<0.05 μm, the area in which the copper layer 106a and the sealing resin 102 are in contact with each other is decreased, and the anchoring effect of the sealing resin 102 to the copper layer 106a is reduced, so that the bond strength between the copper layer 106a and the sealing resin 102 is degraded. Thus, peeling may occur at the interface between the copper layer 106a and the sealing resin 102.

Thus, it is preferable that the arithmetical mean roughness Ra of the copper layer 106a in the central portion on the upper surface that becomes the mounting portion in which the semiconductor element 87 is mounted is 0.05 μm≦Ra≦30 μm.

On the other hand, it is preferable that the arithmetical mean roughness Ra on the lower surface of the copper layer 106b on the opposite side to the upper surface on which the semiconductor element 107 is mounted satisfies Ra≦30 μm. In general, the package 100 for accommodating a semiconductor element is connected to a supporting substrate made of a metal substance such as aluminum or copper, or a ceramic substance having a high thermal conductivity by screwing or with melted metal or brazing material such as solder. In this case, when the arithmetical mean roughness Ra on the lower surface of the copper layer 106b is Ra>30 μm, it is difficult to adhere sufficiently the package 108 for accommodating a semiconductor element to the supporting substrate, and gaps or voids are generated between the two components. As a result, it is possible that the heat generated in the semiconductor element 107 cannot efficiently be transferred from the package 108 for accommodating a, semiconductor element to the supporting substrate. Therefore, it is preferable that the surface of the copper layer 106b on the lower surface is smooth so as to obtain good adhesiveness with the supporting substrate.

It is preferable that the arithmetical mean roughness Ra on the lower surface of the copper layer 106b on the opposite side to the upper surface on which the semiconductor element 107 is mounted is Ra≦30 μm, and the surface is smooth.

Figure 8:
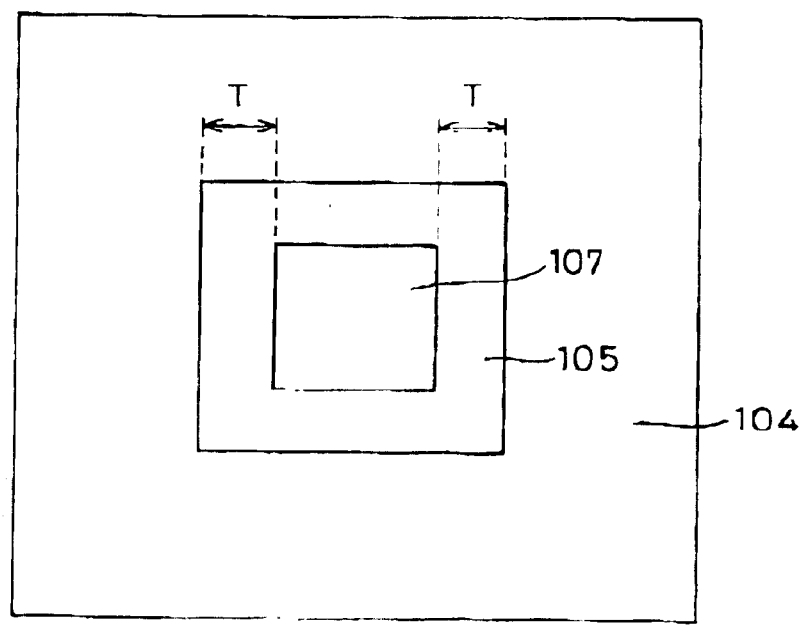
FIG. 8 is a plan view of a substrate formed of a matrix of tungsten or molybdenum and copper when a heat releasing member of the package for accommodating a semiconductor element of the invention is viewed from a side of a mounting portion.

As to shown in the plan view of the substrate 104 formed of a matrix of tungsten or molybdenum and copper when the heat releasing member 103 is viewed from the side of the mounting portion in FIG. 8, the through-metal member 105 is formed so an to have an outer circumference that is larger than the outer circumference of the semiconductor element 7 by a thickness T of the substrate 104, that is, an outer circumference that is apart outward from the outer circumference of the semiconductor element 107 by a thickness T of the substrate 104 over the entire outer circumference thereof. In general, in the case of an isotropic material, heat is transmitted equally in the plane direction and the vertical direction, and consequently is transmitted with a spread of about 45 degrees. Therefore, it is preferable that the through-metal member 105 has an outer circumference that is larger than the outer circumference of the semiconductor element 107 by a thickness T of the substrate 104 in order to obtain about 45 degrees as the angle 114 made by the through-metal member 105 and the region of the mounting portion for the semiconductor element 107.

It is preferable that the thickness of the copper layers 106 (106a, 106b) is 800 μm or less, because when the thickness thereof is larger than 800 μm, the stress generated by the difference in the thermal expansion between the substrate 104 and the copper layers 106 (106a, 106b) is increased so that sufficient bond strength cannot be obtained. When the thickness of the copper layers 106 (106a, 106b) is 50 μm or more, heat generated with operation of the semiconductor element 107 is spread sufficiently in the plane direction of the copper layers 106 (106a, 106b), so that the heat releasing properties of the heat releasing member 103 are further improved.

The material of the copper layers 106 (106a, 106b) joined to the upper and the lower surfaces of the substrate 104 of the heat releasing member 103 is not limited to pure copper, but can be various copper alloys including copper as the main component, as long as it has good heat conductivity and provides sufficient bond strength with the substrate 104, which is a matrix of tungsten or molybdenum and copper. This also applies to the through-metal member 105 made of copper.

For the copper layers 106 (106a, 106b) joined to the upper and the lower surfaces of the heat releasing member 103, it is sufficient that of the upper and the lower surfaces of a portion in which the through-metal members 105 are buried, for example, the copper layers 106 (106a, 106b) are formed at least in a mounting portion of the semiconductor element 107 and a joint portion of external heat releasing plate. It is not necessary that the copper layers 106 (106a, 106b) are formed so as to cover the entire surface of the upper and the lower surfaces of the heat releasing member 103.

Thus, according to the package 108 for accommodating a semiconductor element of the invention as described above, the semiconductor element 107 is adhered and fixed onto the mounting portion of the heat releasing member 103 via the adhesive 110 made of glass, resin or brazing materials, end each electrode of the semiconductor element 107 is electrically connected to the predetermined wiring conductor 111 via the bonding wire 112, and is electrically connected to the external lead terminal 116 attached to the wiring conductor 111 for interconnection, if necessary. Thereafter, the sealing resin 102 is injected to the recess 101a formed by the heal releasing member 103 and the insulating frame 101 so as to seal the semiconductor element 107, and the semiconductor element 107 is accommodated in the recess 101a. Thus, the semiconductor device can be obtained as A product.

Figure 9:
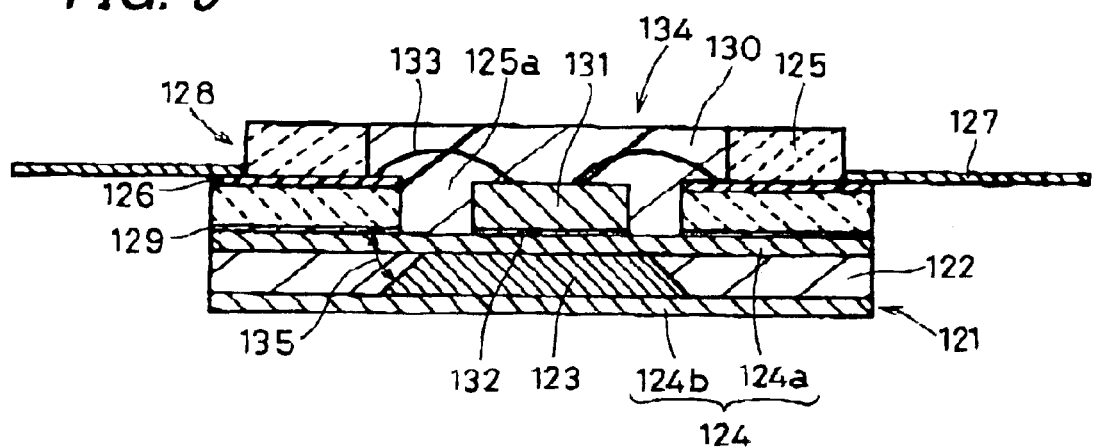
FIG. 9 is a cross-sectional view showing a package for accommodating a semiconductor element and a semiconductor device using the same according to a seventh embodiment of the invention.

FIG. 9 is a cross-sectional view showing a package for accommodating a semiconductor element and a semiconductor device using the same according to a seventh embodiment of the invention. Reference numeral 121 denotes a heat releasing member, reference numeral 122 denotes a substrate of the heat releasing member 121, reference numeral 123 denotes a through-metal member, reference numeral 124 (124a, 124b) denotes copper layers, reference numeral 125 denotes an insulating frame as a frame, reference numeral 125a denotes a recess, reference numeral 126 denotes a wiring conductor, reference numeral 127 denotes a lead terminal, and reference numeral 130 denotes a sealing resin. The heat releasing member 121 and the insulating frame 125 and the sealing resin 130 constitute a semiconductor-element-accommodating package 128 for accommodating a semiconductor element 131. After the semiconductor element 131 is mounted on a mounting portion of the heat releasing member 121, the sealing resin 130 is injected to the recess 125a formed of the heat releasing member 121 and the insulating frame 125 so as to cover the mounting portion to seal the semiconductor element 131. Thus, a semiconductor device 134 of the invention is formed.

The insulating frame 125 is made of an aluminum oxide sintered substance, a mullite sintered substance, a glass ceramic wintered substance or the like, and is adhered, fixed and attached to the upper, surface of the heat releasing member 121 by surrounding the mounting portion via a brazing material 129. When adhering and fixing with the brazing material 129, in general, a metal layer (not shown) for brazing is formed in a joint portion at the insulating frame 125 and the heat releasing member 121.

The semiconductor element 131 is fixed to the mounting portion, which is a central portion of the upper surface of the heat releasing member 121, via an adhesive 132 such as resin, glass, or brazing materials. When a brazing material is used as the adhesive 132, in general, a metal layer (not shown) for brazing is formed in a joint portion of the heat releasing member 121 with the semiconductor element 131. However, when sufficient brazing can be achieved with the copper layer 124 (124*a*) jointed to the upper surface of the through-metal member 123 of the heat releasing member 121, a metal layer for brazing is not particularly necessary.

For example, when the insulating frame 125 is made of an aluminum oxide sintered substance, the insulating frame 125 can be produced in the same manner with the insulating frames 5, 25, 45, 65, 81 and 101 as described above.

In the insulating frame 125, the wiring conductor 126 extending from the periphery of the mounting portion inside a recess 125*a* formed by the heat releasing member 121 and the insulating frame 125 to the outer surface of the insulating frame 125 is formed, and each electrode of the semiconductor element 131 is electrically connected to one end inside the recess 125*a* of the wiring conductor 126 via a bonding wire 133.

The wiring conductor 126 is made of a high melting point metal such as tungsten or molybdenum, and formed by the following manner. A metal paste obtained by adding and mixing a suitable organic binder, solvent or the like to a metal powder such as tungsten or molybdenum is applied and printed in a predetermined pattern onto the ceramic green sheets that become the insulating frame 125 by screen printing or the like. Thus, the wiring conductor 126 is formed from the periphery of the mounting portion inside the recess 125*a* formed by the heat releasing member 121 and the insulating frame 125 to the outer surface of the insulating frame 125.

Furthermore, when a metal such as nickel or gold having excellent corrosion resistance and excellent bonding properties with respect to the bonding wire 133 is attached onto the exposed surface of the wiring conductor 126 in a thickness of 1 to 20 μm by plating, oxidation corrosion of the wiring conductor 126 can be effectively prevented and the bonding wire 133 can be connected firmly to the wiring conductor 126. Therefore, it is preferable to attach a metal such as nickel or gold having excellent corrosion resistance and excellent bonding properties onto the exposed surface of the wiring conductor 126 in a thickness of 1 to 20 μm.

The heat releasing member 121 has a function of absorbing the heat generated with operation of the semiconductor element 131 and dissipating the heat to the air, or transferring the heat to an external heat releasing platen. The heat releasing member 121 can be obtained in the following manner, for example. A tungsten powder or a molybdenum powder having an average particle size of 5 to 40 μm is molded into a frame-like shape by pressure so that a single through-portion is formed in the mounting portion for the semiconductor element 131, and is wintered in an atmosphere with 1300 to 1600° C., then the heat releasing member 121 ran be obtained. A porous member having the single through portion formed in the mounting portion for the semiconductor element 131 from the upper surface to the lower surface is produced beforehand. This porous member is impregnated with 10 to 50 mass % of copper at about 1200° C. in a hydrogen atmosphere, then the plate-like substrate 122 formed of a matrix of tungsten or molybdenum and copper is produced. The heat releasing member 121 is formed by burying the single through-metal member 123 made of copper in the central portion of the substrate 122 from the upper surface to the lower surface, furthermore, by covering the upper surface of the substrate 122 and the through metal member 123 with the copper layer 124*a* and by covering the lower surface of the substrate 122 and the through metal member 123 with the copper layer 124*b* to joint the copper layers 124*a* and 124*b*.

When, of the copper layers 124, the copper layer 124*a* on the upper surface of the heat releasing member 121 that becomes the mounting portion for the semiconductor element 131 has Ra>30 μm, where Ra is the arithmetical mean roughness on the upper surface thereof, voids may be generated in the adhesive 132 when the semiconductor element 131 is adhered and fixed thereto via the adhesive 132 such as glass, resin or brazing materials. The voids generated in the adhesive 132 not only degrade the bond strength between the semiconductor element 131 and the heat releasing member 121, but also inhibit heat transfer between the semiconductor element 131 and the heat releasing member 121 so that the heat dissipation properties of the package 128 for accommodating a semiconductor element and the semiconductor device 131 can be degraded.

It is preferable that the arithmetical mean roughness Ra on the upper surface of the copper layer 124*b* of the substrate 122 on which the semiconductor element 131 is mounted is Ra≦30 μm, and the surface is smooth.

The through-metal member 123 is formed such that the size of its upper surface is equal to the size of the semiconductor element 131 in the mounting portion and its lower surface is larger than the upper surface. In general, in the case of an isotropic material, heat is transmitted equally in the plane direction and the vertical direction, and consequently is transmitted with a spread of about 45 degrees with respect to the plane direction and the vertical direction. Therefore, it is preferable that the angle 15 made by the side face of the through-metal member 123 and the region of the mounting portion for the semiconductor element 131 is about 45 degrees, and that the size of the cross sectional area of the through-metal member 123 is increased from the upper surface to the lower surface with an inclination angle of about 45 degree at its side face in this manner.

On the other hand, it is preferable that the arithmetical mean roughness Ra on the lower surface of the copper layer 124*b* joined to the lower surface of the substrate 122 and the through-metal member 123 on the opposite side to the upper surface on which the semiconductor element 131 is mounted satisfies Ra≦30 μm. The package 128 for accommodating a semiconductor element of the invention may be connected to a supporting substrate made of a metal substance such as aluminum or copper, or a ceramic substance having a high thermal conductivity by screwing or with melted metal or brazing material such as solder. In this case, when the arithmetical mean roughness Ra on the lower surface of the copper layer 124*b* is Ra>30 μm, it is difficult to adhere sufficiently the package 128 for accommodating a semiconductor element to the supporting substrate, and gaps or voids are generated between the two components. As a result, it is possible that the heat generated in the semiconductor element 131 cannot efficiently be transferred from the package 128 for accommodating a semiconductor element to the supporting substrate. Therefore, it is preferable that the lower surface that is the outer surface of the copper layer 124b on the lower surface is smooth and Ra≦30 μm so as to obtain good adhesiveness with the supporting substrate.

It is preferable that the thickness of the copper layers 124 (124a, 124b) is 800 μm or less, because when the thickness thereof is larger than 800 μm, the stress generated by the difference in the thermal expansion between the substrate 122 and the copper layers 124 (124a, 124b) is increased so that sufficient bond strength cannot be obtained. When the thickness of the copper layers 124 (124a, 124b) is 50 μm or more, heat generated with operation of the semiconductor element 131 is spread sufficiently in the plane direction of the copper layers 124 (124a, 124b), so that the heat releasing properties of the heat releasing member 121 are further improved.

The material of the copper layers 124 (124a, 124b) joined to the upper and the lower surfaces of the substrate 122 of the heat releasing member 121 is not limited to pure copper, but can be various copper alloys including copper as the main component, as long as it has good heat conductivity and provides sufficient bond strength with the substrate 122, which is a matrix of tungsten or molybdenum and copper. This also applies to the through-metal member 123 made of copper.

Thus, according to the package 128 for accommodating a semiconductor element of the invention as described above, the semiconductor element 131 is adhered and fixed onto the mounting portion of the heat releasing member 121 via the adhesive 132 made of glass, resin or brazing materials, and each electrode of the semiconductor element 131 is electrically connected to the predetermined wiring conductor 126 via the bonding wire 133. Thereafter, the sealing resin 130 is injected to the recess 125a formed by the heat releasing member 121 and the insulating frame 125 so as to cover the mounting portion and seal the semiconductor element 131. Thus, the semiconductor device 134 can be obtained as a product.

Figure 10:
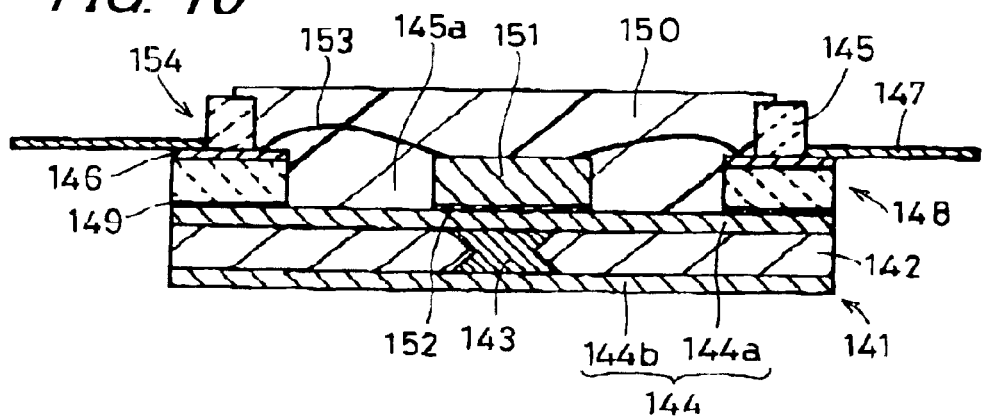
FIG. 10 is a cross-sectional view showing a package for accommodating a semiconductor element and a semiconductor device using the same according to an eighth embodiment of the invention.

FIG. 10 is a cross-sectional view showing a package for accommodating a semiconductor element and a semiconductor device using the same according to an eighth embodiment of the invention. Reference numeral 141 denotes a heat releasing member, reference numeral 142 denotes a substrate of the heat releasing member 141, reference numeral 143 denotes a through-metal member, reference numeral 144 (144a, 144b) denotes copper layers, reference numeral 145 denotes an insulating frame, reference numeral 146 denotes a wiring conductor, reference numeral 147 denotes a lead terminal, and reference numeral 150 denotes a sealing resin. The heat releasing member 141 and the insulating frame 145 and the sealing resin 150 constitute a semiconductor-element-accommodating package 148 for accommodating a semiconductor element 151. After the semiconductor element 151 is mounted on a mounting portion of the heat releasing member 141, the sealing resin 150 is injected to a recess 145a formed by the heat releasing member 141 and the insulating frame 145 so as to cover the mounting portion to seal the semiconductor element 151. Thus, a semiconductor device 14 of the invention is formed.

The insulating frame 145 is made of an aluminum oxide sintered substance, a mullite sintered substance, a glass ceramic sintered substance or the like, and is adhered, fixed and attached to the upper surface of the heat releasing member 141 by surrounding the mounting portion via a brazing material 149. When adhering and fixing with the brazing material 149, in general, a metal layer (not shown) for brazing is formed in a joint portion of the insulating frame 145 and the heat releasing member 141.

The semiconductor element 151 is fixed to the mounting portion, which is a central portion of the upper surface of the heat releasing member 141, via an adhesive 152 such as resin, glass, or brazing materials. When a brazing material is used as the adhesive 152, in general, a metal layer (not shown) for brazing is formed in a joint portion of the heat releasing member 141 with the semiconductor element 151. However, when sufficient brazing can be achieved with the copper layer 144 (144a) jointed to the upper surface of the heat releasing member 141, a metal layer for brazing is not particularly necessary.

For example, when the insulating frame 145 is made of an aluminum oxide sintered substance, the insulating frame 145 can be produced in the same manner with the insulating frames 5, 25, 45, 65, 81, 101 and 125 as described above.

In the insulating frame 145, the wiring conductor 146 extending from the periphery of the mounting portion inside a recess 145a formed by the, heat releasing member 141 and the insulating frame 145 to the outer surface of the insulating frame 145 is formed, and each electrode of the semiconductor element 151 is electrically connected to one end inside the recess 125a of the wiring conductor 126 via a bonding wire 153.

The wiring conductor 146 is made of a high melting point metal such as tungsten or molybdenum, and formed by the following manner. A metal paste obtained by adding and mixing a suitable organic binder, solvent or the like to a metal powder such as tungsten or molybdenum is applied and printed in a predetermined pattern onto the ceramic green sheets that become the insulating frame 145 by screen printing or the like. Thus, the wiring conductor 146 is formed from the periphery of the mounting portion inside the recess 145a formed by the heat releasing member 141 and the insulating frame 145 to the outer surface of the insulating frame 145.

Furthermore, when a metal such as nickel or gold having excellent corrosion resistance and excellent bonding properties with respect to the bonding wire 153 is attached onto the exposed surface of the wiring conductor 146 in a thickness of 1 to 20 μm by plating, oxidation corrosion of the wiring conductor 146 can be effectively prevented and the bonding wire 153 can be connected firmly to the wiring conductor 146. Therefore, it is preferable to attach a metal such as nickel or gold having excellent corrosion resistance and excellent bonding properties onto the exposed surface of the wiring conductor 146 in a thickness of 1 to 20 μm.

The heat releasing member 141 has a function of absorbing the heat generated with operation of the semiconductor element 151 and dissipating the heat to the air, or transferring the heat to an external heat releasing plate. The heat releasing member 141 can be formed in the following manner. For example, a tungsten powder or a molybdenum powder having an average particle size of 5 to 40 μm is molded by pressure so that a through-hole is formed in the mounting portion for the semiconductor element 151, and is sintered in an atmosphere with 1300 to 1600° C. Thus, a porous member having the through-hole formed in the mounting portion for the semiconductor element 151 from the upper surface to the lower surface is produced beforehand. This porous member is impregnated with 10 to 50 mass % of copper at about 1200° C. in a hydrogen atmosphere. Thus, a plate-like substrate 2 formed of a matrix of tungsten or molybdenum and copper is produced. The through-metal member 143 made of copper is buried in a through-hole formed in the mounting portion in the center of this substrate 142 from the upper surface to the lower surface in the mounting portion of the substrate 142. Then, the copper layer 144*a* is joined thereto so as to cover the upper surface of the substrate 142 and the through-metal member 143, and the copper layer 144*b* is joined thereto to cover the lower surface of the substrate 142 and the through-metal member 143.

The cross-section area of the through-metal member 143 can be gradually increased toward the joint portion with the copper layer 144 (144*a*, 144*b*) in a shape of a step or a slope.

The cross-section area of the through-metal member 143 can be increased gradually from the center side of the substrate 142 to the joint portion with the copper layer 144 (144*a*, 144*b*) in the following manner. A porous member that becomes the substrate 142 is formed, and a through-hole in which the through-metal member 143 is buried is formed. Thereafter, the edge portion of the opening of this through-hole can be shaped into a predetermined shape with an end mill processing machine or the like. Thus, either shape of a step-like or a slope-like shape can be produced.

A step-like or a slope-like shape can be produced by making a jig pin forming the through-hole in which the through-metal member 143 is buried into a step-like or a slope-like shape toward the opening of the through-hole, when forming the porous member that becomes the substrate 142 by molding a tungsten powder or a molybdenum powder by pressure.

When, of the copper layers 144, the copper layer 144*a* on the upper surface of the substrate 142 that becomes the mounting portion for the semiconductor element 151 has Ra>30 μm, where Ra is the arithmetical mean roughness on the upper surface thereof, voids may be generated in the adhesive 152 when the semiconductor element 151 is adhered and fixed thereto via the adhesive 152 such as glass, resin or brazing materials. The voids generated in the adhesive 152 not only degrade the bond strength between the semiconductor element 151 and the heat releasing member 141, but also inhibit heat transfer between the semiconductor element 151 and the heat releasing member 141 so that the heat dissipation properties of the package 148 for accommodating a semiconductor element and the semiconductor device 154 can be degraded.

The through-metal member 143 is formed such that the cross-section area thereof is increased gradually from the center side of the substrate 142 to the joint portion with the copper layer 144 (144*a*, 144*b*). When the cross-section area is uniform like a commonly used through-hole member, the through-metal member expands and pushes up the copper layers on the upper and the lower surface of the substrate at the time of high temperatures when assembling the package for accommodating a semiconductor element. Then, the through-metal member starts to be shrunk when being cooled, but does not completely return to the original state, because copper has been plastically deformed. As a result, the surface roughness of the copper layers is increased. On the other hand, when the through-metal member 143 is formed such that the cross-section area thereof is increased gradually from the center side of the substrate 142 to the joint portion with the copper layer 144 (144*a*, 144*b*), the edge portion of the opening of the through-hole in which the through-metal member 143 is buried and that is in contact with the copper layers 144 (144*a*, 144*b*) and formed in the plate-like substrate 142 formed of a matrix of tungsten or molybdenum and copper forms an obtuse angle. As a result, the contact friction resistance between the through-metal member 143 and the substrate 142 is reduced, so that the through-metal member 143 that has expanded and been plastically deformed at high temperatures in assembling the package 148 for accommodating a semiconductor element can easily return to the original state at the time of cooling. Consequently, it is prevented that the copper layers 144 (144*a*, 144*b*) positioned above and below the through-metal member 143 are pushed up and pulled back so that the surface roughness thereof is increased.

When the cross-section area thereof is increased gradually from the center side of the substrate 142 to the joint portion with the copper layer 144 (144*a*, 144*b*), it is preferable that the cross-section area of the through-metal member 143 in the joint portion with the copper layers 144 (144*a*, 144*b*) is 10% larger than that of the portion positioned in the central portion of the substrate 142. The cross-section area of the through-metal member 143 can be increased up to the middle point between the adjacent through-metal members 143.

On the other hand, it is preferable that the arithmetical mean roughness Ra on the lower surface of the copper layer 144*b* joined to the lower surface of the substrate 142 on the opposite side to the upper surface on which the semiconductor element 151 is mounted satisfies Ra≦30 μm. In general, the package 148 for accommodating a semiconductor element is connected to a supporting substrate made of a metal substance such as aluminum or copper, or a ceramic substance having a high thermal conductivity by screwing or with melted metal or brazing material such as solder. In this case, when the arithmetical mean roughness Ra on the lower surface of the copper layer 144*b* of the substrate 142 is Ra>30 μm, it is difficult to adhere sufficiently the package 148 for accommodating a semiconductor element to the supporting substrate, and gaps or voids are generated between the two components. As a result, it is possible that the heat generated in the semiconductor element 147 cannot efficiently be transferred from the package 148 for accommodating a semiconductor element to the supporting substrate. Therefore, it is preferable that the lower surface that is the outer surface of the copper layer 144*b* on the lower surface is smooth so as to obtain good adhesiveness with the supporting substrate.

It is preferable that the arithmetical mean roughness Ra on the lower surface of the copper layer 144*b* joined to the lower surface of a portion in which the through-metal member 143 of the substrate 142 is buried on the opposite side to the upper surface on which the semiconductor element 151 is mounted is Ra≦30 μm, and the surface is smooth.

It is preferable that the thickness of the copper layers 144 (144*a*, 144*b*) is 800 μm or less, because when the thickness thereof is larger than 800 μm, the stress generated by the difference in the thermal expansion between the substrate 142 and the copper layers 144 (144*a*, 144*b*) is increased so that sufficient bond strength cannot be obtained. When the thickness of the copper layers 144 (144*a*, 144*b*) is 50 μm or more, heat generated with operation of the semiconductor element 11 is spread sufficiently in the plane direction of the copper layers 144 (144*a*, 144*b*), so that the heat releasing properties of the heat releasing member 141 are further improved.

The material of the copper layers 144 (144*a*, 144*b*) joined to the upper and the lower surfaces of the substrate 142 of the heat releasing member 141 is not limited to pure copper, but can be various copper alloys including copper as the main component, as long as it has good heat conductivity and provides sufficient bond strength with the substrate 142, which is a matrix of tungsten or molybdenum and copper. This also applies to the through-metal member 143 made of copper.

It is sufficient that the copper layers 144 (144*a*, 144*b*) joined to the upper and the lower surfaces of the substrate 142 of the heat releasing member 141 are formed at least, for example, in the mounting portion for the semiconductor element 151 and the joint portion with the external heat releasing plate of the upper and the lower surfaces of a portion in which the plurality of through-metal member 143 are buried, and it is not necessary that the copper layers 144 (144*a*, 144*b*) are formed so as to cover the entire surface of the upper and the lower surfaces of the heat releasing member 141 as shown in FIG. 10.

Thus, according to the package 148 for accommodating a semiconductor element described above, the semiconductor element 151 is adhered and fixed onto the mounting portion of the heat releasing member 141 via the adhesive 152 made of glass, resin or brazing materials, and each electrode of the semiconductor element 151 is electrically connected to the predetermined wiring conductor 146 via the bonding wire 153. Thereafter, the sealing resin 150 is injected into the recess 145*a* formed by the heat releasing member 141 and the insulating frame 145 so as to cover the mounting portion to seal the semiconductor element 151 in the recess 145*a*, and thus the semiconductor device 154 can be obtained as a product.

Figure 11:
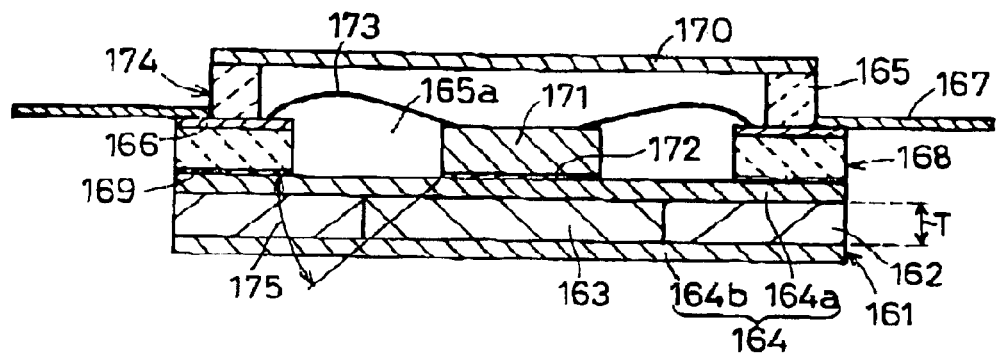
FIG. 11 is a cross-sectional view showing a package for accommodating a semiconductor element and a semiconductor device using the same according to a ninth embodiment of the invention.
Figure 12:
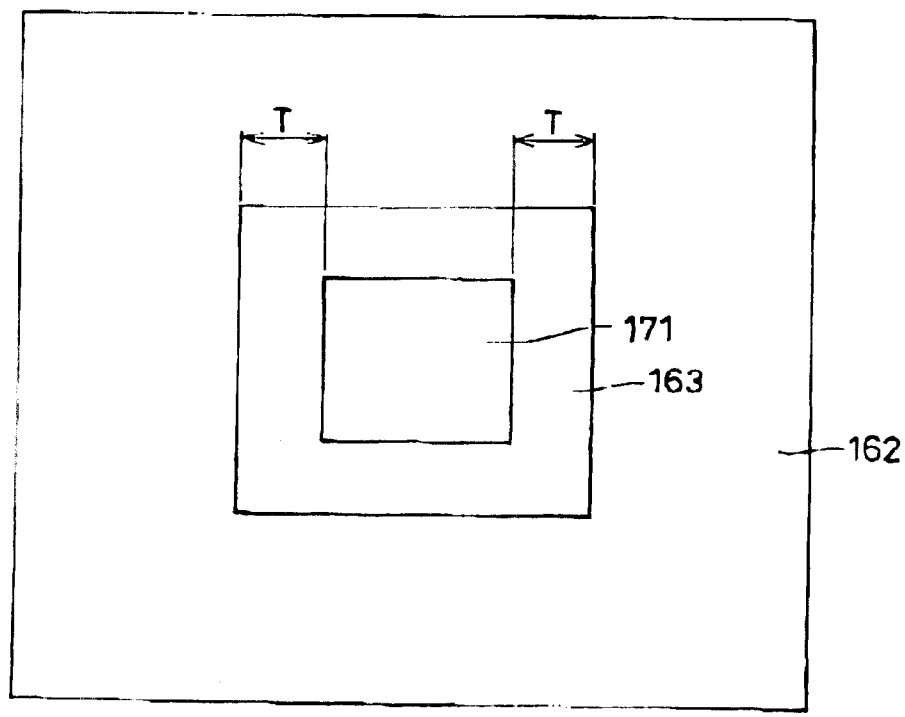
FIG. 12 is a plan view of a substrate when a heat releasing member of the invention is viewed from a side of a mounting portion.

FIG. 11 is a cross-sectional view showing a package for accommodating a semiconductor element using the heat releasing member, and a semiconductor device using the same according to a ninth embodiment of the invention, and shows one example of a package for accommodating a semiconductor element and semiconductor device of the invention. In FIG. 11, reference numeral 161 denotes a heat releasing member, reference numeral 162 denotes a substrate of the heat releasing member 161, reference numeral 163 denotes a through-metal member, reference numeral 164 (164*a*, 164*b*) denotes a copper layer, reference numeral 165 denotes an insulating frame as a frame, reference numeral 166 denotes a wiring conductor, reference numeral 167 denotes a lead terminal, and reference numeral 170 denotes a lid. The heat releasing member 161 and the insulating frame 165 and the lid 170 constitute a semiconductor-element-accommodating package 168 for accommodating a semiconductor element 171. After the semiconductor element 171 is mounted on a mounting portion of the heat releasing member 161, the lid 170 is attached to the upper surface of the insulating frame 165 for sealing in such a manner that the mounting portion is covered, and thus a semiconductor device 174 is formed.

The insulating frame 165 is made of an aluminum oxide sintered substance, a mullite sintered substance, a glass ceramic sintered substance or the like, and is adhered and fixed to the upper surface of heat releasing member 161 surrounding the mounting portion via a brazing material 169. When adhering and fixing with the brazing material 169, in general, a metal layer (not shown) for brazing is formed in a joint portion of the insulating frame 165 and the heat releasing member 161.

The semiconductor element 161 is fixed to the mounting portion, which is a central portion of the upper surface of the heat releasing member 161, via an adhesive 172 such as resin, glass, or brazing materials. When a brazing material is used as the adhesive 172, in general, a metal layer (not shown) for brazing is formed in a joint portion of the heat releasing member 161 with the semiconductor element 171. However, when sufficient brazing can be achieved with the copper layer 164 (164*a*) jointed to the mounting portion on the upper surface of the heat releasing member 161, a metal layer for brazing is not particularly necessary.

For example, when the insulating frame 165 is made of an aluminum oxide sintered substance, the insulating frame 65 can be produced in the same manner with the insulating frames 5, 25, 45, 65, 81, 101, 125 and 145 as described above.

In the insulating frame 165, the wiring conductor 66 extending from the periphery of the mounting portion inside a recess 165*a* formed by the heat releasing member 161 and the insulating frame 165 to the outer surface of the insulating frame 165 is formed, and each electrode of the semiconductor element 171 is electrically connected to one end inside the recess 165*a* of the wiring conductor 166 via a bonding wire 173.

The wiring conductor 166 is made of a high melting point metal such as tungsten or molybdenum, and formed by the following manner. A metal paste obtained by adding and mixing a suitable organic binder, solvent or the like to a metal powder such as tungsten or molybdenum is applied and printed in a predetermined pattern onto the ceramic green sheets that become the insulating frame 165 by screen printing or the like. Thus, the wiring conductor 166 is formed from the periphery of the mounting portion inside the recess 165*a* formed by the heat releasing member 161 and the insulating frame 165 to the outer surface of the insulating frame 165.

Furthermore, when a metal such as nickel or gold having excellent corrosion resistance and excellent bonding properties with respect to the bonding wire 173 is attached onto the exposed surface of the wiring conductor 166 in a thickness of 1 to 20 µm by plating, oxidation corrosion of the wiring conductor 166 can be effectively prevented and the bonding wire 173 can be connected firmly to the wiring conductor 166. Therefore, it is preferable to attach a metal such as nickel or gold having excellent corrosion resistance and excellent bonding properties onto the exposed surface of the wiring conductor 166 in a thickness of 1 to 20 µm.

The heat releasing member 161 has a function of absorbing the heat generated with operation of the semiconductor element 171 and dissipating the heat to the air, or transferring the heat to an external heat releasing plate. For example, a tungsten powder or a molybdenum powder having an average particle size of 5 to 40 µm is molded into a frame-like shape by pressure, and is sintered in an atmosphere with 1300 to 1600° C. so as to be impregnated with 10 to 50 mass % of copper, and then drilling is performed with respect to the frame-like shape to form the through-metal member 163 in the central portion of the substrate 162 from the upper surface to the lower surface. The frame-like shape formed from the upper surface to the lower surface in the mounting portion for the semiconductor element 171 is filled with a predetermined amount of diamond particles and a silver and copper alloy powder, and then sintered by being fired at a temperature of 800 to 1000° C. in a vacuum atmosphere. Thus, the heat releasing member 161 including the frame-like substrate 162 formed of a matrix of tungsten or molybdenum and copper and having the single through-conductor, the through-metal member 163 made of diamond and a silver-copper alloy that is buried in the central portion of, the substrate 162 from the upper surface to the lower surface, the copper layer 164*a* joined thereto so as to cover the upper surface of the substrate 162 and the through-metal member 163, and the copper layer 164b joined to the lower surface of the substrate 162 and the through-metal member 163 is formed.

In this embodiment, for the diamond and the silver-copper alloy constituting the through-metal member 163, it is preferable regarding the constitutional ratio of the diamond and the silver-copper alloy that the constitutional ratio of the diamond is 60 to 40 mass %, and that the constitutional ratio of the silver-copper alloy is 40 to 60 mass %. When the constitutional ratio of the diamond is more than 60 mass %, the silver-copper alloy component that is filled between the diamond particles is insufficient, so that in some portions inside the through-metal member 163, bonding between the diamond and the silver-copper alloy is insufficient. Therefore, a sufficiently dense component cannot be obtained, and consequently it tends to be difficult to transmit efficiently the heat generated in the semiconductor element 171 through the through-metal member 163. When the constitutional ratio of the diamond is less than 40 mass %, the through-metal member 163 can be sufficiently dense inside, but the heat conductivity of the through-metal member 163 is significantly reduced, depending on the heat conductivity of the silver-copper alloy. As a result, it tends to be difficult to transmit efficiently the heat generated in the semiconductor element 171 through the through-metal member 163.

The heat releasing member 161 of the invention can be obtained in the following manner. Diamond and a silver-copper alloy are weighed in predetermined amounts to provide the constitutional ratio as above, and then a powder obtained by mixing these components is filled in the frame-like substrate 162 formed of a matrix of tungsten or molybdenum and copper by pressure. The upper surface and the lower surface of the substrate 162 are sandwiched by the copper layers 164a and 164b, and sintering is performed at a temperature of 780° C. to 900° C. in a reducing atmosphere. Thus, the heat releasing member 161 can be obtained. At this time, the heat releasing member 161 has a dense structure in which the surrounding of the diamond is filled with the silver-copper alloy in the form of a matrix, so that the high heat conductivity of the diamond can be exhibited efficiently and utilized. Thus, since the heat conductivity of the through-metal member 163 is sufficiently high, the heat generated in the semiconductor element 171 can be released to the air efficiently.

When, of the copper layers 164, the copper layer 164a on the upper surface of the heat releasing member 161 that becomes the mounting portion for the semiconductor element 171 has Ra>30 μm, where Ra is the arithmetical mean roughness on the upper surface thereof, voids may be generated in the adhesive 172 when the semiconductor element 171 is adhered and fixed thereto via the adhesive 172 such as glass, resin or brazing materials. The voids generated in the adhesive 172 not only degrade the bond strength between the semiconductor element 171 and the heat releasing member 161, but also inhibit heat transfer between the semiconductor element 171 and the heat releasing member 161 so that the heat dissipation properties of the package 168 for accommodating a semiconductor element and the semiconductor device 174 can be degraded.

Therefore, it is preferable that the arithmetical mean roughness Ra of the copper layer 164a on the upper surface of the substrate 162 that becomes the mounting portion for the semiconductor element 171 satisfies Ra≦30 μm so that its surface is smooth.

As shown in the plan view of the substrate 162 when the heat releasing member 161 is viewed from the side of the mounting portion in FIG. 8, thee through-metal member 163 is formed so as to have an outer circumference that is larger than the outer circumference of the semiconductor element 171 by a thickness T of the substrate 162, that is, an outer circumference that is apart outward from the outer circumference of the semiconductor element 171 by a thickness T of the substrate 162 over the entire outer circumference thereof. In general, in the case of an isotropic material, heat is transmitted equally in the plane direction and the vertical direction, and consequently is transmitted with a spread of about 45 degrees. Therefore, it is preferable-that the through-metal member 163 has an outer circumference that is larger than the outer circumference of the semiconductor element 171 by a thickness T of the heat releasing member 161 in order to obtain about 45 degrees as the angle 175 made by the through-metal member 163 and the region of the mounting portion for the semiconductor element 171.

On the other hand, it is preferable that the arithmetical mean roughness Ra on the lower surface of the copper layer 164b joined to the lower surface of the substrate 162 and the through-metal member 163 on the opposite side to the upper surface on which the semiconductor element 171 is mounted satisfies Ra≦30 μm. In general, the package 168 for accommodating a semiconductor element is connected to a supporting substrate made of a metal substance such as aluminum or copper or a ceramic substance having a high thermal conductivity by screwing or with melted metal or brazing material such as solder. In this case, when the arithmetical mean roughness Ra on the lower surface of the copper layer 164b is Ra>30 μm, it is difficult to adhere sufficiently the package 168 for accommodating a semiconductor element to the supporting substrate, and gaps or voids are generated between the two components. As a result, it is possible that the heat generated in the semiconductor element 171 cannot efficiently be transferred from the package 168 for accommodating a semiconductor element to the supporting substrate. Therefore, it is preferable that the lower surface, which is the outer surface of the copper layer 164b on the lower surface, is as smooth so as to have arithmetical mean roughness Ra≦30 μm to obtain good adhesiveness with the supporting substrate.

It is preferable that the thickness of the copper layers 164 (164a, 164b) is 800 μm or less, because when the thickness thereof is larger than 800 μm, the stress generated by the difference in the thermal expansion between the substrate 162 and the copper layers 164 (164a, 164b) is increased so that sufficient bond strength cannot be obtained. When the thickness of the copper layers 164 (164a, 164b) is 50 μm or more, heat generated with operation of the semiconductor element 171 is spread sufficiently in the plane direction of the copper layers 164 (164a, 164b), so that the heat releasing properties of the heat releasing member 161 are further improved.

The material of the copper layers 164 (164a, 164b) joined to the upper and the lower surfaces of the substrate 162 of the, heat releasing member 161 and the through-metal member 163 is not limited to pure copper, but can be various copper alloys including copper as the main component, as long as it has good heat conductivity and provides sufficient bond strength with the substrate 162, which is a matrix of tungsten or molybdenum and copper, and the through-metal member 163 made of copper.

Thus, according to, the package 168 for accommodating a semiconductor element described above, the semiconductor element 171 is adhered and fixed onto the mounting portion of the heat releasing member 161 via the adhesive 172 made of glass, resin or brazing materials, and each electrode of the semiconductor element 171 is electrically connected to the predetermined wiring conductor 166 via the bonding wire 173. Thereafter, the lid 170 is attached to the upper surface of the insulating frame, 165 so as to cover the mounting portion to seal the semiconductor element 171 in the recess 165a, and thus the semiconductor device 174 can be obtained as a product.

Figure 13:
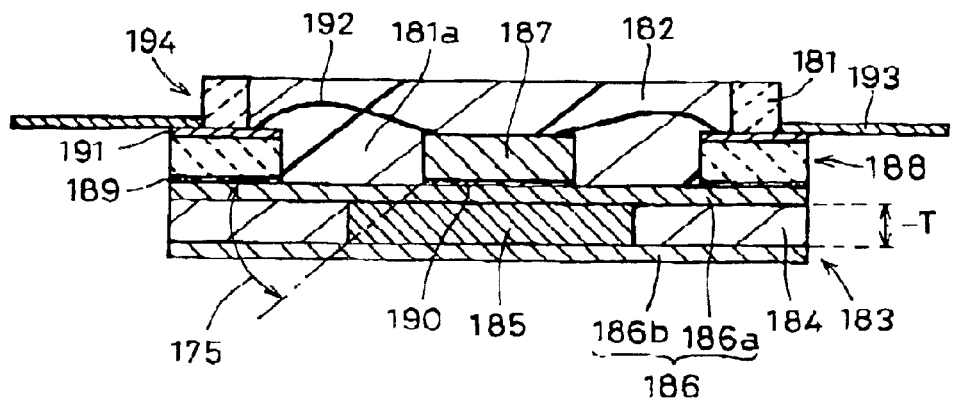
FIG. 13 is a cross-sectional view showing a package for accommodating a semiconductor element and a semiconductor device using the same according to a tenth embodiment of the invention.

Next, FIG. 13 is a cross-sectional view showing a package for accommodating a semiconductor element using the heat releasing member, and a semiconductor device using the same according to a tenth embodiment of the invention, and shows another example of a package for accommodating a semiconductor element and semiconductor device of the invention. In FIG. 13, reference numeral 181 denotes an insulating frame as a frame, reference numeral 182 denotes a sealing resin, and reference numeral 183 denotes a heat releasing member. The insulating frame 181, the sealing resin 182 and the heat releasing member 183 constitute a semiconductor-element-accommodating package 188 for accommodating a semiconductor element 187. After the semiconductor element 187 is mounted on a mounting portion of the heat releasing member 183, the sealing resin 182 such as epoxy is injected to a recess made of the insulating frame 181 and the heat releasing member 183 to seal the semiconductor element 187, and thus a semiconductor device 194 of the invention is formed.

In this package 188 for accommodating a semiconductor element and the semiconductor device 193, the insulating frame 181, the heat releasing member 183, and the semiconductor element 187 are the same as the insulating frame 165, the heat releasing member 161, and the semiconductor element 171, respectively, which have been described above.

The insulating frame 181 is adhered and fixed to the heat releasing member 183 via a brazing material 189. In the heat releasing member 183, the semiconductor element 187 is adhered and fixed onto the mounting portion in the central portion on the upper surface thereof via an adhesive 190.

In the insulating frame 161, a wiring conductor 191 extending from a recess 181a formed by the insulating frame 181 and the heat releasing member 183 to the outer surface of the insulating frame 181 is formed, and each electrode of the semiconductor element 187 is electrically connected to one end the wiring conductor 191 via a bonding wire 192.

The heat releasing member 183 has a function of absorbing the heat generated with operation of the semiconductor element 187 and dissipating the heat to the air. A through-metal member 185 is buried in a substrate 184 formed of a matrix of tungsten or molybdenum and copper, and copper layers 186 (186a, 186b) are jointed to the upper and the lower surfaces thereof. Thus, the heat releasing member 183 of the package 188 for accommodating a semiconductor element of the invention is formed.

In this embodiment, for the through-metal member 185 made of diamond and a silver-copper alloy, it is preferable regarding the constitutional ratio of the diamond and the silver-copper alloy that the constitutional ratio of the diamond is 60 to 40 mass %, and that the constitutional ratio of the silver-copper alloy it 40 to 60 mass %. When the constitutional ratio of the diamond is more than 60 mass %, the silver-copper alloy component that is filled between the diamond particles is insufficient, so that in some portions inside the through-metal member 185, bonding between the diamond and the silver-copper alloy is insufficient. Therefore, a sufficiently dense component cannot be obtained, and consequently it tends to be difficult to transmit efficiently the heat generated in the semiconductor element 187 through the through-metal member 185. When the constitutional ratio of the diamond is less than 40 mass %, the through-metal member 185 can be sufficiently dense inside, but the heat conductivity of the through-metal member 185 is significantly reduced, depending on the heat conductivity of the silver-copper alloy. As a result, it tends to be difficult to transmit efficiently the heat generated in the semiconductor element 187 through the through-metal member 185.

The heat releasing member 183 of the invention can be obtained in the following manner. Diamond and a silver-copper alloy are weighed in predetermined amounts to provide the constitutional ratio as above, and then a powder obtained by mixing these components is filled in the frame-like substrate 184 formed of a matrix of tungsten or molybdenum and copper by pressure. The upper surface and the lower surface of the substrate 184 are sandwiched by the copper layers 186a and 186b, and sintering is performed at a temperature of 780° C. to 900° C. in a reducing atmosphere. Thus, the heat releasing member 183 can be obtained. At this time, the heat releasing member 183 has a dense structure in which the surrounding of the diamond is filled with the silver-copper alloy in the form of a matrix, so that the high heat conductivity of the diamond can be exhibited efficiently and utilized. Thus, since the heat conductivity of the through-metal member 185 is sufficiently high, the heat generated in the semiconductor element 187 can be released to the air efficiently.

In this heat releasing member 183 as well, in the copper layer 186 (186a), the central portion on the upper surface on which the semiconductor element 187 is mounted is, for example, polished so that the arithmetical mean roughness Ra is $0.05 \leq Ra \leq 30 \mu m$. Thus, the bond strength between the copper layer 186a and the sealing resin 182 is satisfactory, and the package 188 for accommodating a semiconductor element and the supporting substrate are attached sufficiently so that the heat generated in the semiconductor element 187 can be transmitted efficiently from the package 188 for accommodating a semiconductor element to the supporting substrate.

Figure 14:
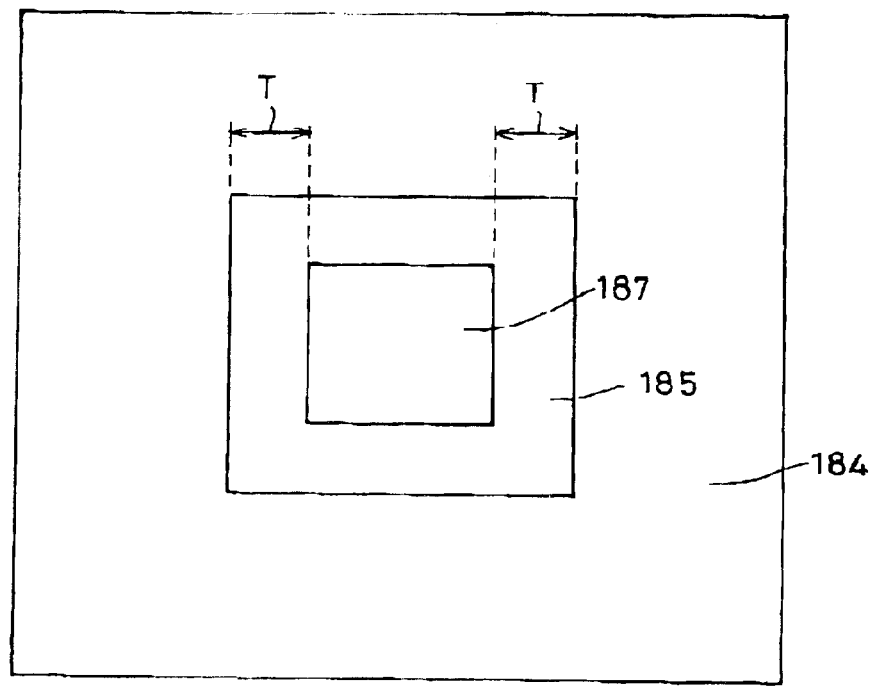
FIG. 14 is a plan view of a substrate when a heat releasing member of the invention is viewed from a side of a mounting portion.

As shown in the plan view of the substrate 184 when the heat releasing member 183 is viewed from the side of the mounting portion in FIG. 14, the through-metal member 185 also is formed so as to have an outer circumference that is larger than the outer circumference of the semiconductor element 187 by a thickness T of the substrate 184 of the heat releasing member 183, that is, an outer circumference that is apart outward from the outer circumference of the semiconductor element 187 by a thickness T of the substrate 184 over the entire outer circumference thereof.

It is preferable that the thickness of the copper layers 186 (186a, 186b) is 800 $\mu m$ or less, in order to obtain sufficient bond strength between the substrate 184 formed of a matrix and the copper layers 186 (186a, 186b). When the thickness of the copper layer 186a is 50 $\mu m$ or more, heat generated with operation of the semiconductor element 187 is spread sufficiently in the plane direction of the copper layer 186a, so that the heat releasing properties of the heat releasing member 183 are further improved.

The material of the copper layers 186 (186a, 186b) joined to the upper and the lower surfaces of the heat releasing member 183 is not limited to pure copper, but can be various copper alloys including copper as the main component, as long as it has good heat conductivity and provides sufficient bond strength with the substrate 184 formed of a matrix of tungsten or molybdenum and copper.

It is sufficient that the copper layers 186 (186*a*, 186*b*) joined to the upper and lower surfaces of the heat releasing member 183 are formed at least on the upper and lower surfaces of a portion in which the through-metal member 185 is buried, for example, in the mounting portion for the semiconductor element 187 and the joint portion with the external heat releasing plate, and it is not necessary to cover entirely the upper and the lower surfaces of the heat releasing member 183.

Thus, according to the package 188 for accommodating a semiconductor element of the invention as described above, the semiconductor element 187 is adhered and fixed onto the mounting portion of the heat releasing member 183 via the adhesive 190 made of glass, resin or brazing materials, and each electrode of the semiconductor element 187 is electrically connected to the predetermined wiring conductor 191 via the bonding wire 192, and is electrically connected to the external lead terminal 193 attached to the wiring conductor 191 for interconnection, if necessary. Thereafter, the sealing resin 182 is injected to the recess 181*a* formed by the heat releasing member 183 and the insulating frame 181 so as to seal the semiconductor element 187, and the semiconductor element 187 is accommodated in the recess 181*a*. Thus, the second semiconductor device 194 can be obtained as a product.

The invention is not limited to the above examples of the embodiments, and various modifications can be made within the scope not departing from the gist of the invention. For example, in order to dissipate heat generated in the semiconductor element from the heat releasing member to the air, a heat releasing fin can be connected to the copper layer joined to the lower surface of the substrate and the through-metal member of the heat releasing member, or a heat releasing fin can be integrated to the heat releasing member by joining the heat releasing fin with brazing or the like. Thus, the functions that the heat generated with operation of the semiconductor element is absorbed by the heat releasing member and dissipated to the air can be improved further.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

As described in the embodiments of the invention, the insulating frames are used as a frame. Instead of the insulating frames, other frames such as metal frames may be used as a frame.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the, meaning and the range of equivalency of the claims are therefore intended to be embraced therein.

What is claimed is:

1. A heat releasing member comprising:
   a frame-like substrate made of a matrix of tungsten or molybdenum and copper,
   a through-metal member made of copper buried from an upper surface to another surface in a central portion of the frame-like substrate, and
   copper layers joined onto the one and other surfaces of the substrate and the through-metal member so as to cover the one and other surfaces thereof.

2. A heat releasing member comprising:
   a frame-like substrate made of a matrix of tungsten or molybdenum and copper,
   a through-metal member made of diamond and a silver-copper alloy copper buried from an upper surface to another surface in a central portion of the frame-like substrate, and
   copper layers joined onto the one and other surfaces of the substrate and the through-metal member so as to cover the one and other surfaces thereof.

3. A package for accommodating a semiconductor element comprising:
   the heat releasing member of claim 1 being plate-like and having a mounting portion on which a semiconductor element is mounted in a central portion on its upper surface; and
   a frame attached onto one surface of the heat releasing member so as to surround the mounting portion and having a plurality of wiring conductors extending from a periphery of the mounting portion inside to an outer surface.

4. The package of claim 3, wherein the through-metal member has an outer circumference larger than that of the semiconductor element by the thickness of the substrate.

5. The package of claim 3, wherein a size of the one surface of the through-metal member is equal to a size of the semiconductor element, and a size of the other surface thereof is larger than that of the one surface thereof.

6. The package of claim 3, wherein a cross-section area of the through-metal member is gradually increased from a center side of the substrate to joint portions with the copper layers.

7. The package of claim 3, wherein an arithmetical mean roughness Ra in a central portion of the one surface of the copper layer on which the semiconductor element is mounted is $0.05 \ \mu m \leq Ra \leq 30 \ \mu m$.

8. A package for accommodating a semiconductor element comprising:
   the heat releasing member of claim 2 being plate-like and having a mounting portion on which a semiconductor element is mounted in a central portion on its upper surface; and
   a frame attached onto one surface of the heat releasing member so as to surround the mounting portion and having a plurality of wiring conductors extending from a periphery of the mounting portion inside to an outer surface.

9. The package of claim 8, wherein the through-metal member has an outer circumference larger than that of the semiconductor element by the thickness of the substrate.

10. A package for accommodating a semiconductor element comprising:
    a plate-like heat releasing member having a mounting portion on which a semiconductor element is mounted in a central portion on one surface thereof;
    a frame attached onto the one surface of the heat releasing member so as to surround the mounting portion and having a plurality of wiring conductors extending from a periphery of the mounting portion inside to an outer surface; and
    a lid attached onto on surface of the frame so as to cover the mounting portion, wherein in the heat releasing member, a plurality of through-metal members made of a copper are buried from one surface of the mounting portion of a plate-like substrate made of a matrix of tungsten or molybdenum and copper to another surface, copper layers are joined at least to one and other surfaces of a portion in which the through-metal members of the substrate are buried, and a cross-section area of each of the through-metal members is gradually increased from the center side of the substrate to a joint portion with the copper layers.

11. A package for accommodating a semiconductor element comprising:

a plate-like heat releasing member having a mounting portion on which a semiconductor element is mounted in a central portion on one surface of the plate-like heat releasing member;

a frame attached onto the one surface of the heat releasing member so as to surround the mounting portion; and a terminal attached onto one portion of the frame, wherein after the semiconductor element is mounted, the semiconductor element, the mounting portion, the frame and the terminal are sealed with a sealing resin covering up to the side face of the heat releasing member in such a manner that the end portion on the outer side of the terminal is exposed, and wherein in the heat releasing member, a plurality of through-metal members made of a copper are buried from the one surface of the mounting portion of a plate-like substrate made of a matrix of tungsten or molybdenum and copper to the other surface, copper layers are joined at least to the one surface of a portion of the substrate positioned inside the frame and on the other surface of a portion in which the through-metal members are buried, and an arithmetical mean roughness Ra on the one surface of the portion positioned inside the frame and the side face of the heat releasing member is each $0.05\ \mu m \leq Ra \leq 30\ \mu m$.

12. A semiconductor device comprising:

the package for accommodating a semiconductor element of claim 3; and a semiconductor element mounted in the mounting portion of the package for accommodating a semiconductor element, wherein an electrode of the semiconductor element is electrically connected to the wiring conductor and a lid is attached onto the one surface of the frame so as to cover the mounting portion.

13. A semiconductor device comprising:

the package for accommodating a semiconductor element of claim 3; and a semiconductor element mounted in the mounting portion of the package for accommodating a semiconductor element, wherein an electrode of the semiconductor element is electrically connected to the wiring conductor and a sealing resin is injected into a recess formed by the heat releasing member and the frame to seal the semiconductor element.

14. A semiconductor device comprising:

the package for accommodating a semiconductor element of claim 8; and a semiconductor element mounted in the mounting portion of the package for accommodating a semiconductor element, wherein an electrode of the semiconductor element is electrically connected to the wiring conductor and a lid is attached onto the one surface of the frame so as to cover the mounting portion.

15. A semiconductor device comprising:

the package for accommodating a semiconductor element of claim 8; and a semiconductor element mounted in the mounting portion of the package for accommodating a semiconductor element, wherein an electrode of the semiconductor element is electrically connected to the wiring conductor and a sealing resin is injected into a recess formed by the heat releasing member and the frame to seal the semiconductor element.

16. A semiconductor device comprising:

the package for accommodating a semiconductor element of claim 10; and a semiconductor element mounted in the mounting portion of the package for accommodating a semiconductor element, wherein an electrode of the semiconductor element is electrically connected to the wiring conductor and the lid is attached onto the one surface of the frame so as to cover the mounting portion.

17. A semiconductor device comprising:

the package for accommodating a semiconductor element of claim 11; and a semiconductor element mounted on the mounting portion of the package for accommodating a semiconductor element, wherein an electrode of the semiconductor element is electrically connected to the terminal, and the semiconductor element, the mounting portion, the frame and the terminal are sealed with a sealing resin covering up to the side face of the heat releasing member in such a manner that an end portion on the outer side of the terminal is exposed.

* * * * *